US012805414B2

(12) United States Patent
Jang et al.

(10) Patent No.: US 12,805,414 B2
(45) Date of Patent: Nov. 17, 2026

(54) SEMICONDUCTOR PACKAGE

(71) Applicant: SAMSUNG ELECTRONICS CO., LTD., Suwon-si (KR)

(72) Inventors: Hui Yeong Jang, Suwon-si (KR); Oh Guk Kwon, Suwon-si (KR); Sun Jae Kim, Suwon-si (KR); Jeong Oh Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 426 days.

(21) Appl. No.: 18/545,297

(22) Filed: Dec. 19, 2023

(65) Prior Publication Data

US 2024/0234275 A1 Jul. 11, 2024

(30) Foreign Application Priority Data

Jan. 5, 2023 (KR) ........................ 10-2023-0001499

(51) Int. Cl.
*H01L 23/498* (2006.01)
*H01L 23/00* (2006.01)
(Continued)

(52) U.S. Cl.
CPC ....... *H10W 90/701* (2026.01); *H10W 70/685* (2026.01); *H10W 90/00* (2026.01);
(Continued)

(58) Field of Classification Search
None
See application file for complete search history.

(56) References Cited

U.S. PATENT DOCUMENTS 5,194,931 A * 3/1993 Araki .................... H10W 46/00 257/784
10,256,181 B2 4/2019 Kim et al.
(Continued)

FOREIGN PATENT DOCUMENTS

CN 113614912 A 11/2021
JP 10-256426 A 9/1998
(Continued)

OTHER PUBLICATIONS

Communication dated Aug. 18, 2026 issued by the Korean Intellectual Property Office in counterpart Korean Application No. 10-2023-0001499.

*Primary Examiner* — Asok K Sarkar
(74) *Attorney, Agent, or Firm* — Sughrue Mion, PLLC

(57) ABSTRACT

Provided is a semiconductor package including a printed circuit board (PCB) substrate, a silicon substrate on the PCB substrate, a plurality of through vias penetrating the silicon substrate, a plurality of pads on the silicon substrate and connected to at least some of the plurality of through vias, a semiconductor chip on the plurality of pads and electrically connected to the plurality of pads, and a plurality of connecting terminals between the semiconductor chip and the plurality of pads, wherein the plurality of pads include a first pad that includes a trench and a second pad, and wherein the plurality of connecting terminals include a first connecting terminal connected to the first pad, at least a part of the first connecting terminal being in the trench and a remaining part of the first connecting terminal being on the first pad, and a second connecting terminal connected to the second pad.

20 Claims, 18 Drawing Sheets

(51) Int. Cl.
*H10W 70/685* (2026.01)
*H10W 90/00* (2026.01)

(52) U.S. Cl.
CPC ........ *H10W 90/722* (2026.01); *H10W 90/724* (2026.01); *H10W 90/792* (2026.01); *H10W 90/794* (2026.01)

(56) References Cited

U.S. PATENT DOCUMENTS

| | | | | |
|---|---|---|---|---|
| 2009/0001495 | A1* | 1/2009 | Weng | H10F 39/804 257/433 |
| 2011/0169169 | A1* | 7/2011 | Reinmuth | B81B 7/0006 257/E21.59 |
| 2014/0191397 | A1 | 7/2014 | Kang et al. | |
| 2020/0251437 | A1 | 8/2020 | Park | |
| 2021/0098426 | A1 | 4/2021 | Wang et al. | |
| 2021/0159207 | A1 | 5/2021 | Derakhshandeh et al. | |
| 2021/0183820 | A1* | 6/2021 | Chang | H10W 20/023 |

FOREIGN PATENT DOCUMENTS

| | | |
|---|---|---|
| KR | 10-2005-0079542 A | 8/2005 |
| KR | 10-2022-0154555 A | 11/2022 |

* cited by examiner

3000

SEMICONDUCTOR PACKAGE

CROSS-REFERENCE TO RELATED APPLICATION

This application is based on and claims priority to Korean Patent Application No. 10-2023-0001499 filed on Jan. 5, 2023 in the Korean Intellectual Property Office, the disclosure of which is incorporated herein by reference in its entirety.

BACKGROUND

1. Field

Embodiments of the present disclosure relate to a semiconductor package.

2. Description of Related Art

As semiconductor packages are becoming higher in specifications, a high bandwidth memory (HBM) market is growing accordingly. For example, in the case of the semiconductor package, a semiconductor chip may be mounted on a silicon-based substrate and the mounted semiconductor chip may be molded with a molding material.

The number of high-bandwidth memories increases due to the recent high specification of the sets, and the size of the semiconductor package increases, while the size of the high-bandwidth memory decreases. The decrease in size of the high-bandwidth memory causes problems of an increase in process difficulty of the semiconductor package and a decrease in yield.

SUMMARY

One or more embodiments provide a semiconductor package having improved reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of an embodiment, there is provided a semiconductor package including a printed circuit board (PCB) substrate, a silicon substrate on the PCB substrate, a plurality of through vias penetrating the silicon substrate, a plurality of pads on the silicon substrate and connected to at least some of the plurality of through vias, a semiconductor chip on the plurality of pads and electrically connected to the plurality of pads, and a plurality of connecting terminals between the semiconductor chip and the plurality of pads, wherein the plurality of pads include a first pad that includes a trench and a second pad, and wherein the plurality of connecting terminals include a first connecting terminal connected to the first pad, at least a part of the first connecting terminal being in the trench and a remaining part of the first connecting terminal being on the first pad, and a second connecting terminal connected to the second pad.

According to another aspect of an embodiment, there is provided a semiconductor package including a plurality of lower pads, a plurality of upper pads corresponding to the plurality of lower pads, respectively, the plurality of upper pads being spaced apart from the plurality of lower pads in a first direction, and a plurality of connecting terminals between the plurality of lower pads and the plurality of upper pads, wherein the plurality of lower pads include a first pad having a hollow pillar shape and a second pad having a solid pillar shape, wherein the plurality of connecting terminals include a first connecting terminal connected to the first pad and a second connecting terminal connected to the second pad, wherein the first connecting terminal includes a first portion that overlaps the first pad in a second direction different from the first direction, and a second portion on the first portion, and wherein a height of the second portion in the first direction is equal to a height of the second connecting terminal in the first direction.

According to another aspect of an embodiment, there is provided a semiconductor package including a printed circuit board (PCB) substrate, a silicon substrate on the PCB substrate, a plurality of through vias penetrating the silicon substrate in a vertical direction, wiring patterns on the silicon substrate and connected to the plurality of through vias, a plurality of pads on the silicon substrate and connected to at least some of the wiring patterns, a semiconductor chip on the plurality of pads, electrically connected to the plurality of pads, and including an edge region and a center region defined by the edge region from a plan view, a plurality of diode elements below the semiconductor chip, and in the edge region and not in the center region, and a plurality of connecting terminals between the semiconductor chip and the plurality of pads, wherein the plurality of pads include a first pad of a hollow pillar shape and a second pad of a solid pillar shape, wherein the plurality of connecting terminals include a first connecting terminal in the edge region and connected to the first pad and a second connecting terminal in the center region and connected to the second pad, wherein the first connecting terminal includes a first portion that overlaps the first pad in a horizontal direction intersecting the vertical direction and a second portion on the first portion, wherein the first portion does not overlap the second connecting terminal in the horizontal direction, and wherein a volume of the first connecting terminal is greater than a volume of the second connecting terminal.

BRIEF DESCRIPTION OF DRAWINGS

The above and other aspects and features of the present disclosure will become more apparent by describing in detail exemplary embodiments thereof with reference to the attached drawings, in which.

DETAILED DESCRIPTION

In the present specification, although terms such as first, second, upper and lower are used to describe various elements or components, these elements or components are not limited by these terms. These terms are only used to distinguish a single element or component from other elements or components. Therefore, a first element or component referred to below may be a second element or component within the technical idea of the present disclosure. Further, it goes without saying that a lower element or component referred to below may be an upper element or component within the technical idea of the present disclosure.

Embodiments described herein are example embodiments, and thus, the disclosure is not limited thereto.

It will be understood that when an element or layer is referred to as being “over,” “above,” “on,” “below,” “under,” “beneath,” “connected to” or “coupled to” another element or layer, it can be directly over, above, on, below, under, beneath, connected or coupled to the other element or layer or intervening elements or layers may be present. In contrast, when an element is referred to as being “directly over,” “directly above,” “directly on,” “directly below,” “directly under,” “directly beneath,” “directly connected to” or “directly coupled to” another element or layer, there are no intervening elements or layers present.

A semiconductor package according to some embodiments will be described below in detail with reference to the accompanying drawings.

A semiconductor package according to some embodiments will be described with reference to FIGS. 1 to 4.

Figure 1:
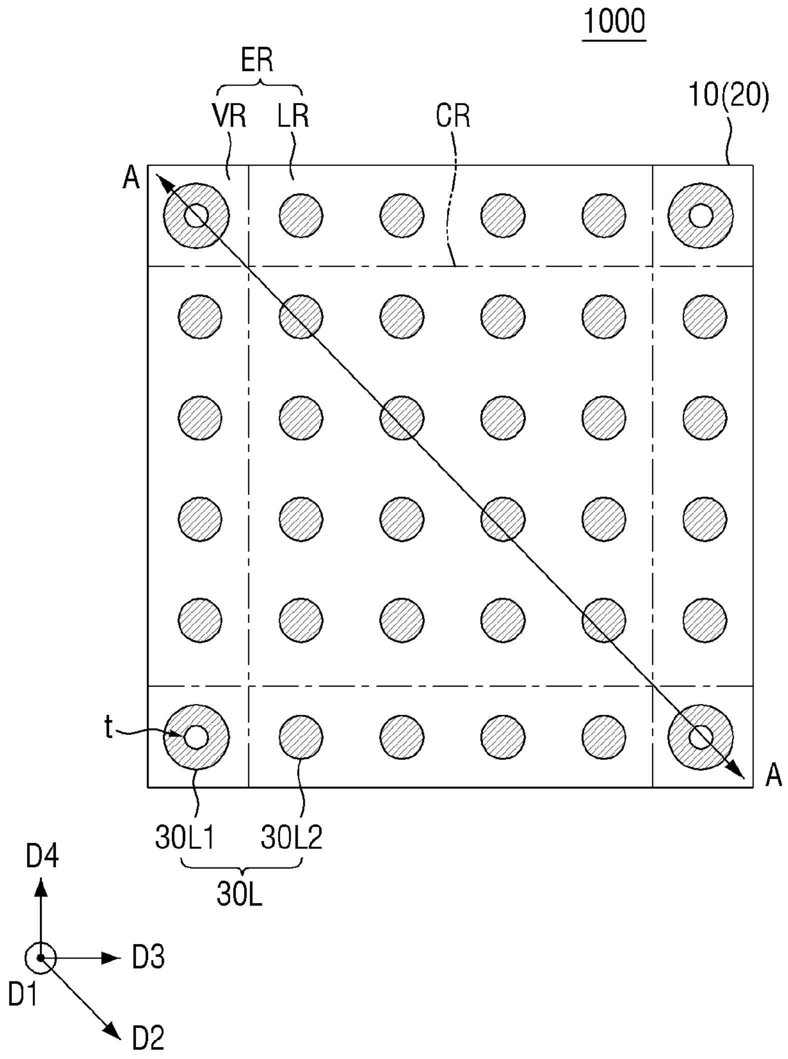
FIG. 1 is an exemplary plan view illustrating the semiconductor package according to some embodiments.
Figure 2:
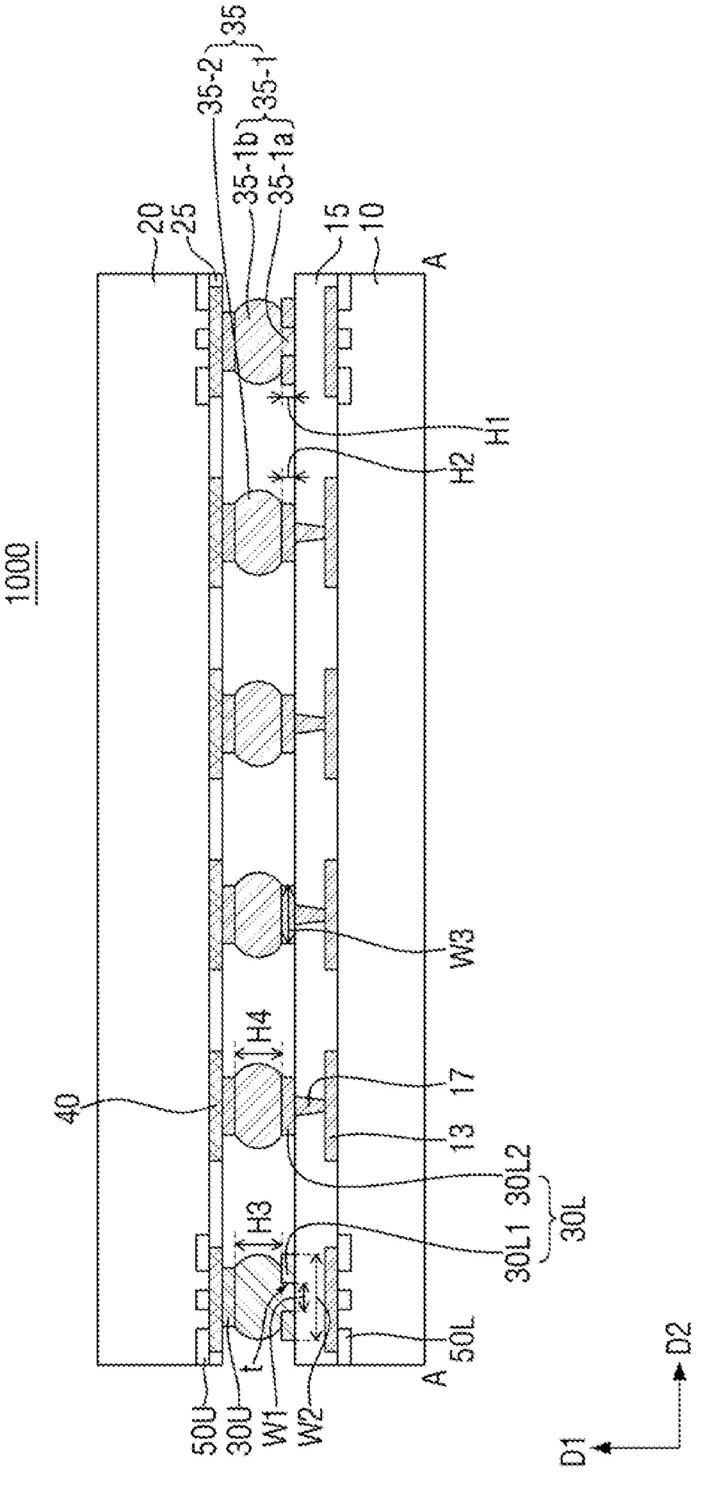
FIG. 2 is a cross-sectional view taken along a line A-A of FIG. 1.
Figure 3:
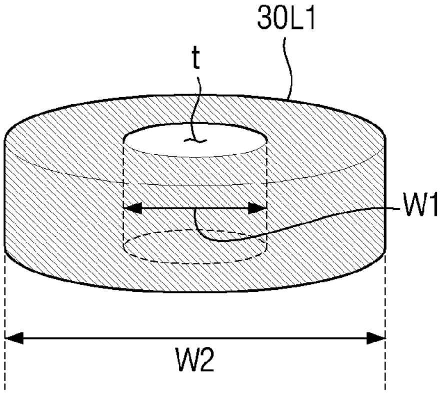
FIG. 3 is an exemplary perspective view of a first pad of FIG. 2.
Figure 4:
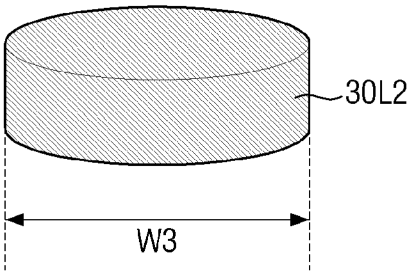
FIG. 4 is an exemplary perspective view of a second pad of FIG. 2.

FIG. 1 is an exemplary plan view illustrating the semiconductor package according to some embodiments. FIG. 2 is a cross-sectional view taken along a line A-A of FIG. 1. FIG. 3 is an exemplary perspective view of a first pad of FIG. 2. FIG. 4 is an exemplary perspective view of a second pad of FIG. 2.

Referring to FIGS. 1 to 4, a semiconductor package 1000 according to some embodiments may include a lower substrate 10, an upper substrate 20, a plurality of lower pads 30L, a plurality of upper pads 35U, and a plurality of connecting terminals 35.

The lower substrate 10 may be, for example, a silicon substrate. The lower substrate 10 may be silicon-on-insulator (SOI). The lower substrate 10 may include, but is not limited to, silicon germanium, silicon germanium on insulator (SGOI), indium antimonide, lead tellurium, indium arsenide, indium phosphide, gallium arsenide or gallium antimonide. Also, the lower substrate 10 may be, but is not limited to, a printed circuit board (PCB) substrate, a semiconductor chip, or a package substrate.

The upper substrate 20 may be provided on the lower substrate 10. The upper substrate 20 may be spaced apart from the lower substrate 10 in the first direction D1. In the present disclosure, the first direction D1 may be a thickness direction of the lower substrate 10. The first direction D1 may be a vertical direction. In the embodiment, the first direction D1 may be substantially perpendicular to a second direction D2, a third direction D3 and a fourth direction D4. The second direction D2, the third direction D3, and the fourth direction D4 may be directions parallel to an upper surface of the lower substrate 10. For example, the second direction D2, the third direction D3, and the fourth direction D4 may be horizontal directions.

The upper substrate 20 may be, for example, a silicon substrate, but embodiments are not limited thereto. For example, the upper substrate 20 may be a semiconductor chip. The upper substrate 20 and the lower substrate 10 may be the same. However, embodiments are not limited thereto.

In some embodiments, each of the lower substrate 10 and the upper substrate 20 may include an edge region ER and a center region CR. From a plan view, when the lower substrate 10 and the upper substrate 20 each have a square shape, the edge region ER may be a corner region ER. The center region CR may be a central region. The center region CR may be defined by the edge region ER. The edge region ER may include a vertex region VR and a line region LR. As an example, there may be four vertex regions VR and four line regions LR, respectively. The line regions LR may include a pair extending in the third direction D3 and a pair extending in the fourth direction D4.

A plurality of lower pads 30L may be provided on the lower substrate 10. The lower pads 30L may be placed between the lower substrate 10 and the upper substrate 20. The lower pads 30L may be placed in the edge region ER and the center region CR.

In some embodiments, the plurality of lower pads 30L may include a plurality of first pads 30L1 and a plurality of second pads 30L2. The plurality of first pads 30L1 may be placed in the edge region ER. For example, the plurality of first pads 30L1 may be placed in the vertex region VR. Some of the plurality of second pads 30L2 may be placed in the center region CR. Some of the plurality of second pads 30L2 may be placed in the edge region ER. At this time, some of the plurality of second pads 30L2 may be placed in the line region LR of the edge region ER. The plurality of second pads 30L2 may not be placed in the vertex region VR. However, embodiments are not limited thereto.

In FIGS. 3 and 4, the first pad 30L1 may have a hollow pillar shape. For example, the first pad 30L1 may include a trench t. The trench t may penetrate the first pad 30L1. The trench t may expose the upper surface and the lower surface of the first pad 30L1. The second pad 30L2 may have a solid pillar shape. However, embodiments are not limited thereto.

Although the first pad 30L1 and the second pad 30L2 are shown to have a columnar shape, embodiments are not limited thereto.

In some embodiments, a width W2 of the first pad 30L1 in the second direction D2 is greater than a width W3 of the second pad 30L2 in the second direction D2. At this time, the width W1 of the trench t in the second direction D2 is smaller than the width W3 of the second pad 30L2 in the second direction D2. A height H1 of the first pad 30L1 in the first direction D1 is equal to a height H2 of the second pad 30L2 in the first direction D1. However, embodiments are not limited thereto.

The plurality of lower pads 30L may include, but are not limited to, a metal material such as copper (Cu) or aluminum (Al).

A plurality of upper pads 30U may be provided on the upper substrate 20. The upper pads 30U may be placed between the lower substrate 10 and the upper substrate 20. The upper pads 30U may correspond to the lower pads 30L.

The upper pads 30U may include, but are not limited to, a metal material such as copper (Cu) or aluminum (Al).

A plurality of connecting terminals 35 may be provided between the lower pads 30L and the upper pads 30U. The plurality of connecting terminals 35 may be connected to the lower pads 30L and the upper pads 30U. One end of each of the plurality of connecting terminals 35 may be connected to the lower pads 30L, and the other end of each of the plurality of connecting terminals 35 may be connected to the upper pads 30U.

In some embodiments, the plurality of connecting terminals 35 may include a plurality of first connecting terminals 35-1 and a plurality of second connecting terminals 35-2.

Each first connecting terminal 35-1 may be connected to each first pad 30L1. Each second connecting terminal 35-2 may be connected to each second pad 30L2. Therefore, the plurality of first connecting terminals 35-1 may be placed in the vertex region VR. Some of the plurality of second connecting terminals 35-2 may be placed in the center region CR. Some of the plurality of second connecting terminals 35-2 may be placed in the edge region ER. At this time, some of the plurality of second connecting terminals 35-2 may be placed in the line region LR of the edge region ER. The plurality of second connecting terminals 35-2 may not be placed in the vertex region VR.

In some embodiments, the first connecting terminal 35-1 may include a first portion 35-1*a* and a second portion 35-1*b*. The first portion 35-1*a* of the first connecting terminal 35-1 is placed in the trench t of the first pad 30L1. The second portion 35-1*b* of the first connecting terminal 35-1 is placed on the first portion 35-1*a* of the first connecting terminal 35-1.

The first portion 35-1*a* of the first connecting terminal 35-1 completely overlaps the first pad 30L1 in the second direction D2. The first portion 35-1*a* of the first connecting terminal 35-1 also completely overlaps the second pad 30L2 in the second direction D2. The second connecting terminal 35-2 is placed on the second pad 30L2. The second connecting terminal 35-2 does not overlap the first pad 30L1 and the second pad 30L2 in the second direction D2. The second connecting terminal 35-2 does not overlap the first portion 35-1*a* of the first connecting terminal 35-1 in the second direction D2. A height H3 of the second portion 35-1*b* of the first connecting terminal 35-1 in the first direction D1 may be equal to a height H4 of the second connecting terminal 35-2 in the first direction D1. However, embodiments are not limited thereto. A volume of the first connecting terminal 35-1 may be greater than a volume of the second connecting terminal 35-2.

The plurality of connecting terminals 35 may be solder bumps including, but are not limited to, low melting-point metals, for example, tin (Sn), tin (Sn) alloys or the like. The plurality of connecting terminals 35 may have various shapes such as a land, a ball, a pin, and a pillar. Also, the plurality of connecting terminals 35 may include under bump metallurgy (UBM).

The semiconductor package 1000 according to some embodiments may further include a lower insulating film 15, an upper insulating film 25, a wiring pattern 13, a first via 17, an upper substrate pad 40, a lower diode element 50L, and an upper diode element 50U.

The lower insulating film 15 may be provided on the lower substrate 10. The lower insulating film 15 may be provided between the lower substrate 10 and the plurality of lower pads 30L. The lower insulating film 15 may include an insulating material. As an example, the lower insulating film 15 may include at least one of silicon oxide, silicon nitride, silicon oxynitride, and a low-k material having a lower dielectric constant than silicon oxide. As another example, the lower insulating film 15 may be made of a photoimageable dielectric. The lower insulating film 15 may include a photosensitive polymer. The photosensitive polymer may be formed from at least one of, for example, photosensitive polyimide, polybenzoxazole, phenolic polymer, and benzocyclobutene-based polymer.

A wiring pattern 13 and a first via 17 may be provided inside the lower insulating film 15. The first via 17 may connect the wiring pattern 13 and the lower pad 30L. For example, the first via 17 may connect the wiring pattern 13 and the second pad 30L2. The wiring pattern 13 and the second pad 30L2 may be electrically connected.

The first via 17 may not connect the wiring pattern 13 and the first pad 30L1.

A via may not be formed between the wiring pattern 13 and the first pad 30L1. For example, the first pad 30L1 may float with the wiring pattern 13. The first pad 30L1 may not be electrically connected to the wiring pattern 13.

The wiring pattern 13 and the first via 17 may each include a conductive material. For example, the wiring pattern 13 and the first via 17 may each include, but is not limited to, copper (Cu).

The upper insulating film 25 may be provided on the upper substrate 20. The upper insulating film 25 may be provided between the upper substrate 20 and the plurality of upper pads 30U. The upper insulating film 25 may include an insulating material. As an example, the upper insulating film 25 may include at least one of silicon oxide, silicon nitride, silicon oxynitride, and a low-k material having a lower dielectric constant than silicon oxide. As another example, the upper insulating film 25 may be made of a photoimageable dielectric. The upper insulating film 25 may include a photosensitive polymer. The photosensitive polymer may be formed from at least one of, for example, photosensitive polyimide, polybenzoxazole, phenolic polymer, and benzocyclobutene-based polymer.

An upper substrate pad 40 may be provided inside the upper insulating film 25. The upper substrate pad 40 may be connected to the upper pad 30U. The upper substrate pad 40 may be in contact with the upper pad 30U. The upper substrate pad 40 may include a conductive material. As an example, the upper substrate pad 40 may include, but is not limited to, aluminum (Al).

The lower diode element 50L may be provided inside the lower substrate 10. The upper diode element 50U may be provided inside the upper substrate 20. The lower diode element 50L and the upper diode element 50U may protect the circuits from static electricity generated from the first connecting terminal 35-1. The lower diode element 50L and the upper diode element 50U may be placed in the edge region ER, and may not be placed in the center region CR. Since the lower diode element 50L and the upper diode element 50U are not placed in the center region CR, various elements may be formed in the lower substrate 10 and the upper substrate 20 of the center region CR. The lower diode element 50L and the upper diode element 50U may each have a diode structure.

A semiconductor package according to some other embodiments will be described below with reference to FIGS. 5 to 8.

Figure 5:
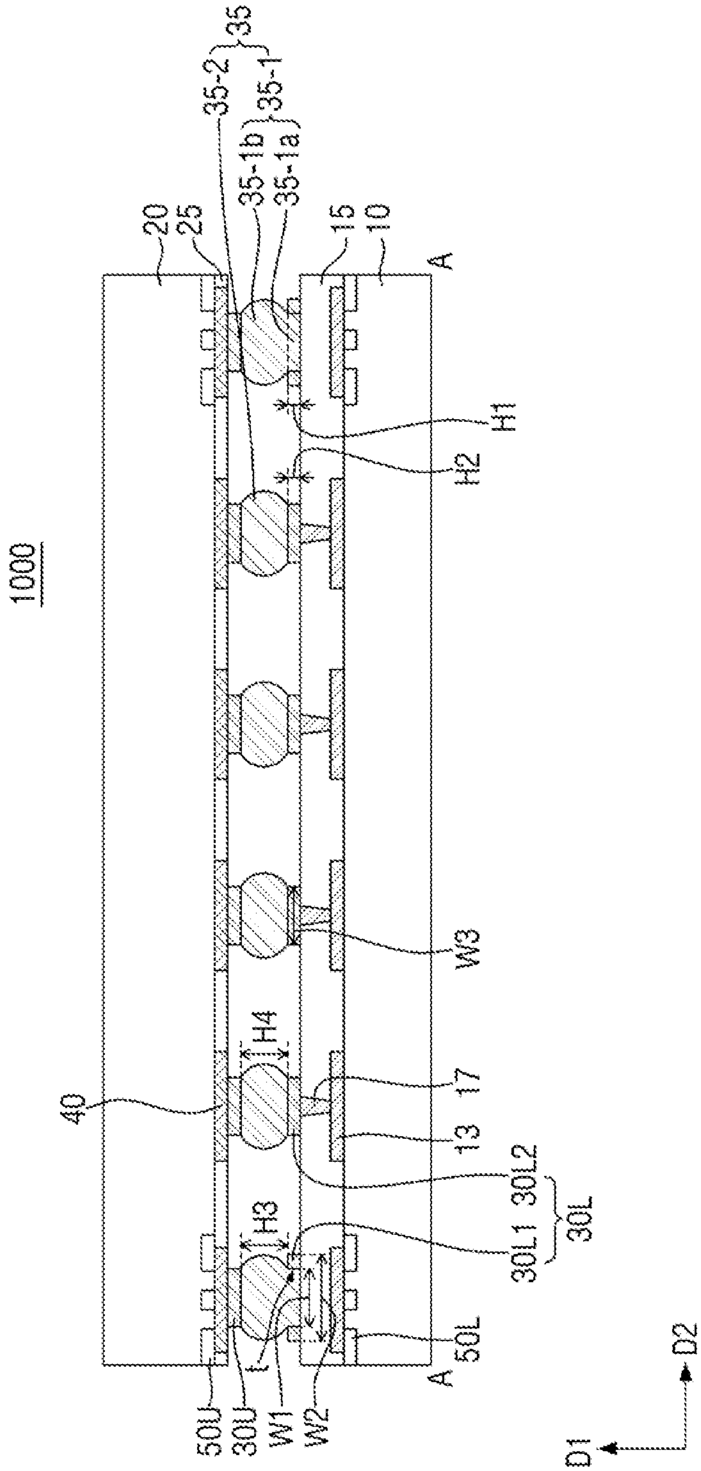
FIGS. 5, 6, and 7 are diagrams illustrating a semiconductor package according to some other embodiments.
Figure 6:
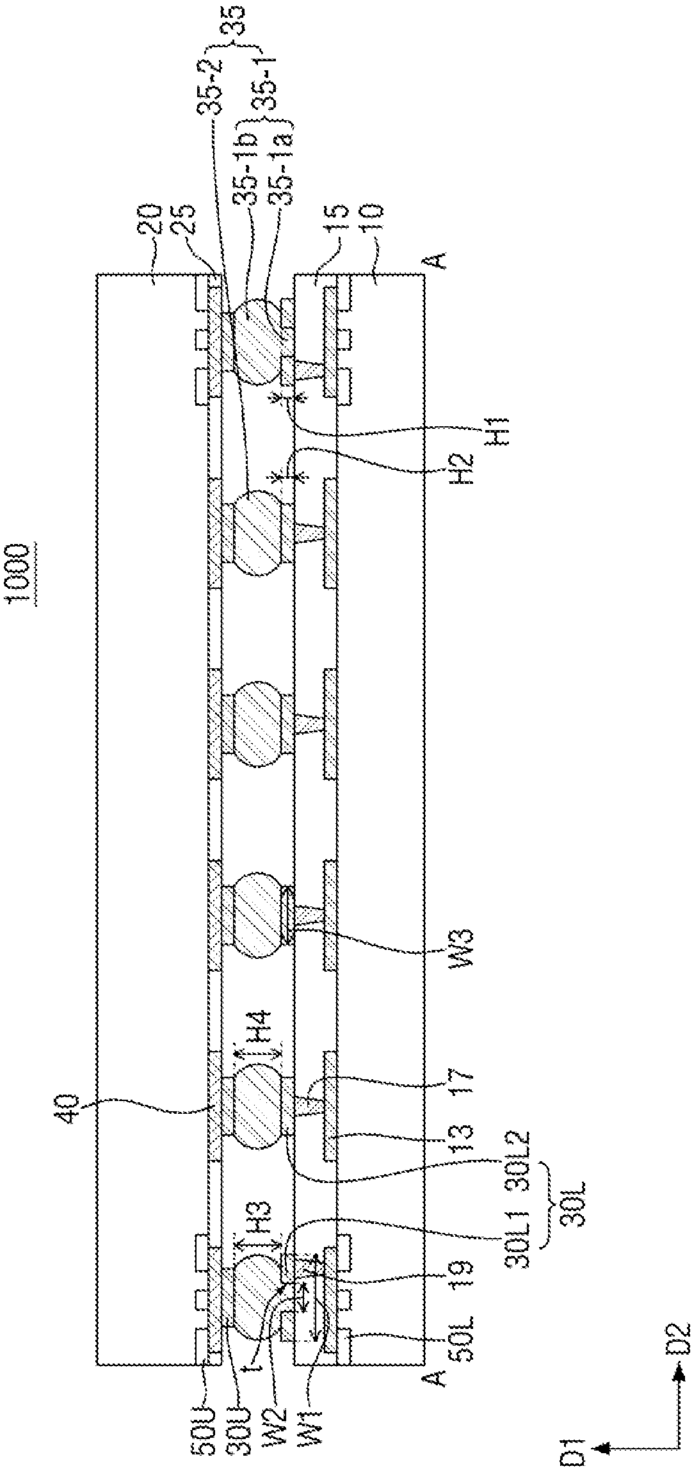
Figure 7:
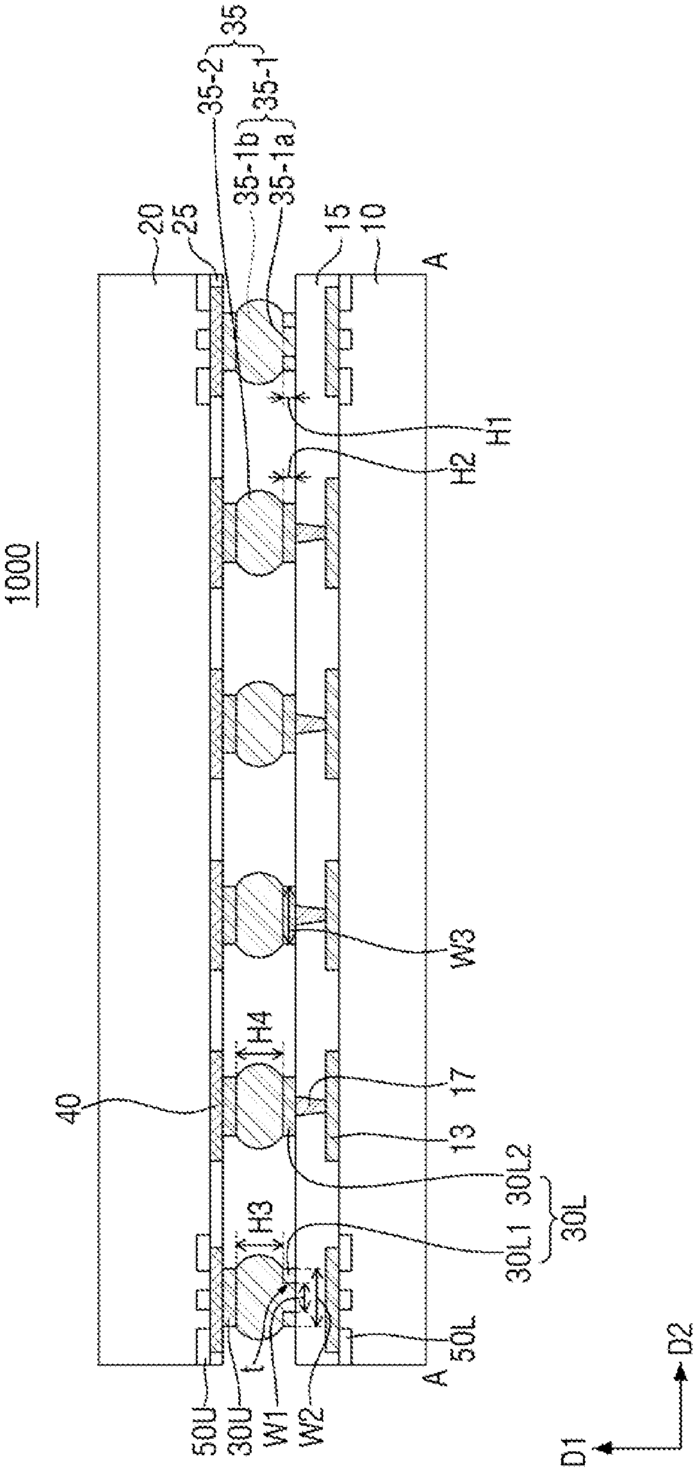

FIGS. 5 to 7 are diagrams illustrating a semiconductor package according to some other embodiments. For convenience of explanation, the explanation will be mainly provided on points different from the contents explained using FIGS. 1 to 4.

First, referring to FIG. 5, a width W2 of the first pad 30L1 in the second direction D2 is greater than a width W3 of the second pad 30L2 in the second direction D2. The width W1 of the trench t in the second direction D2 is equal to the width W3 of the second pad 30L2 in the second direction D2. The width of the first portion 35-1*a* of the first connecting terminal 35-1 in the second direction D2 is equal to the width W3 of the second pad 30L2 in the second direction D2. The volume of the first portion 35-1*a* of the first connecting terminal 35-1 may be equal to the volume of the second pad 30L2.

Referring to FIG. 6, a semiconductor package 1000 according to some embodiments may further a include second via 19.

The second via 19 may be provided between the first pad 30L1 and the wiring pattern 13. The second via 19 may connect the first pad 30L1 and the wiring pattern 13. The second via 19 may electrically connect the first pad 30L1 and the wiring pattern 13. The first connecting terminal 35-1 may be electrically connected to the wiring pattern 13 through the second via 19. The second via 19 may include a conductive material. The second via 19 may include the same material as the first via 17. The second via 19 and the first via 17 may be formed through the same process. For example, the second via 19 may include, but is not limited to, copper (Cu).

Referring to FIG. 7, the width W2 of the first pad 30L1 in the second direction D2 may be equal to the width W3 of the second pad 30L2 in the second direction D2. The width W1 of the trench t in the second direction D2 is smaller than the width W3 of the second pad 30L2 in the second direction D2. The width of the first portion 35-1*a* of the first connecting terminal 35-1 in the second direction D2 is smaller than the width W3 of the second pad 30L2 in the second direction D2. The volume of the first portion 35-1*a* of the first connecting terminal 35-1 may be smaller than the volume of the second pad 30L2.

Figure 8:
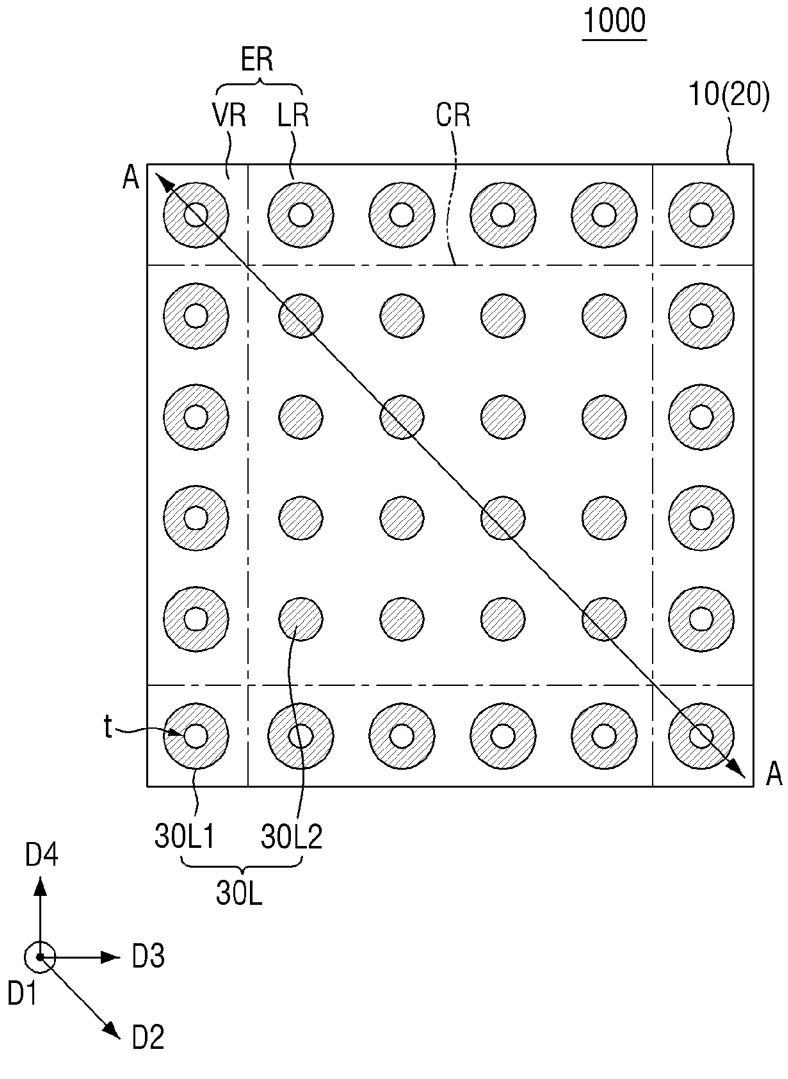
FIG. 8 is a diagram illustrating a semiconductor package according to some other embodiments.

FIG. 8 is a diagram illustrating a semiconductor package according to some other embodiments. For convenience of explanation, the explanation will be mainly provided on points different from the contents explained using FIGS. 1 to 4.

Referring to FIG. 8, the first pad 30L1 may be placed in the line region LR of the edge region ER. The second pad 30L2 may not be placed in the edge region ER. The second pad 30L2 may be placed only in the center region CR. The first pad 30L1 is placed only in the edge region ER. The first connecting terminal (35-1 of FIG. 2) may be placed in the line region LR of the edge region ER. The second connecting terminal (35-2 of FIG. 2) may not be placed in the line region LR of the edge region ER. The second connecting terminal (35-2 of FIG. 2) may be placed only in the center region CR. However, embodiments are not limited thereto.

The semiconductor package according to some other embodiments will be described below with reference to FIGS. 9 to 14.

Figure 9:
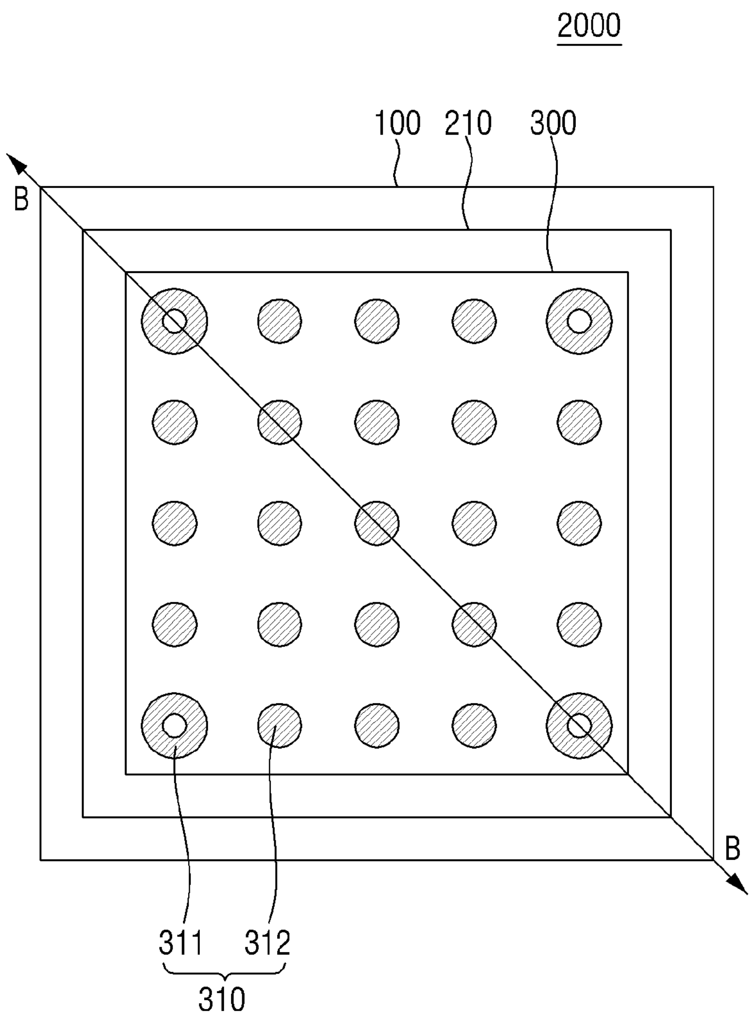
FIG. 9 is an exemplary plan view illustrating a semiconductor package according to another embodiment.
Figure 10:
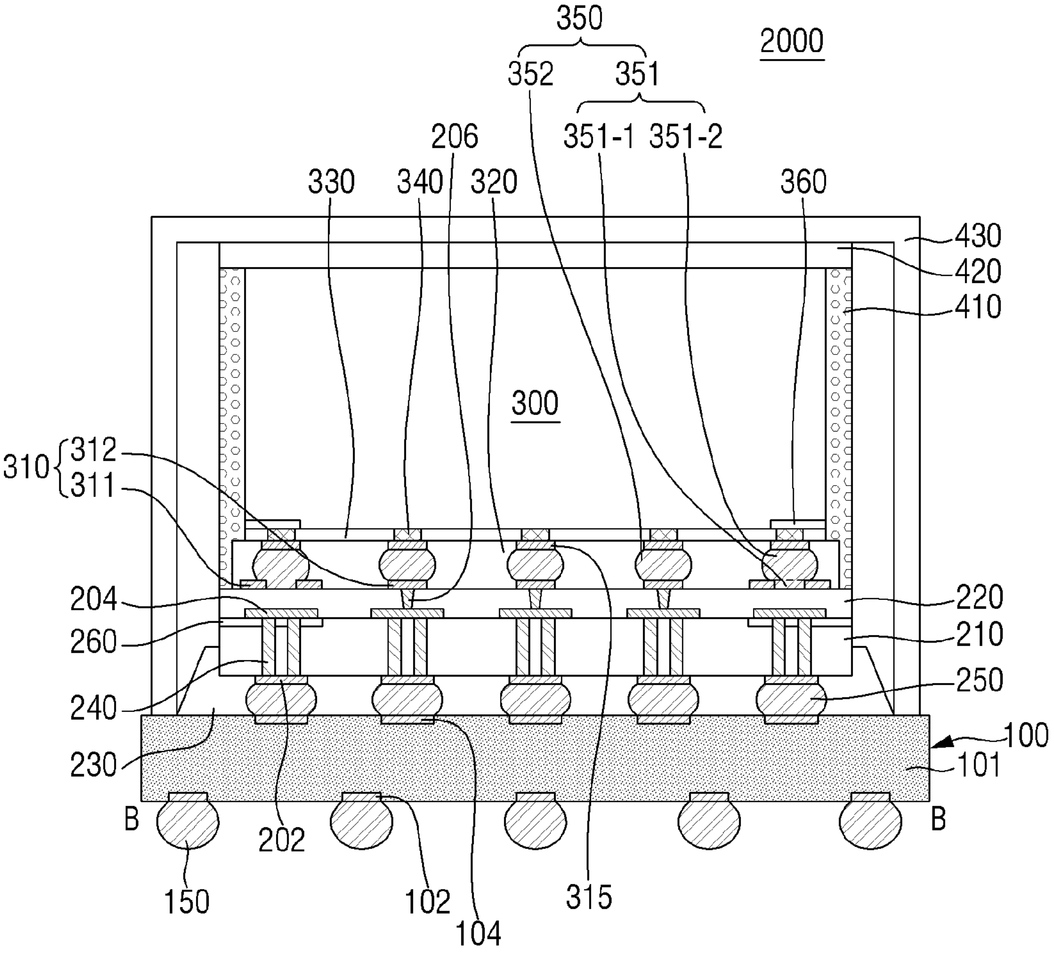
FIG. 10 is a cross-sectional view taken along line B-B of FIG. 9.

FIG. 9 is an exemplary plan view illustrating a semiconductor package according to another embodiment. FIG. 10 is a cross-sectional view taken along line B-B of FIG. 9.

Referring to FIGS. 9 and 10, a semiconductor package 2000 according to some other embodiments may include a PCB substrate 100, a silicon substrate 210, a semiconductor chip 300, a lower pad 310, an upper pad 315, and a plurality of connecting terminals 350.

The PCB substrate 100 may be a substrate for packaging. The PCB substrate 100 may be a printed circuit board (PCB). The PCB substrate 100 may include a lower surface and an upper surfaces that are opposite to each other. The upper surface of the PCB substrate 100 may face the silicon substrate 210.

The PCB substrate 100 may include an insulating core 101, a first substrate pad 102 and a second substrate pad 104. The first substrate pad 102 and the second substrate pad 104 may each be used to electrically connect the PCB substrate 100 with other components. For example, the first substrate pad 102 may be exposed from the lower surface of the insulating core 101, and the second substrate pads 104 may be exposed from the upper surface of the insulating core 101. The lower surface of the first substrate pad 102 and the lower surface of the insulating core 101 may be coplanar, and the upper surface of the second substrate pads 104 and the upper surface of the insulating core 101 may be coplanar. The first substrate pad 102 and the second substrate pad 104 may include, but are not limited to, metallic materials such as copper (Cu) or aluminum (Al).

Wiring patterns for electrically connecting the first substrate pad 102 and the second substrate pad 104 may be formed inside the insulating core 101. Although insulating core 101 is shown to be single layer, embodiments are not limited thereto. For example, the insulating core 101 may include multiple layers, and wiring patterns of multiple layers may be formed therein.

The PCB substrate 100 may be mounted on a motherboard of an electronic device or the like. For example, a first connecting member 150 connected to the first substrate pad 102 may be provided. The PCB substrate 100 may be mounted on a motherboard of an electronic device or the like through the first connecting member 150. The PCB substrate 100 may be, but is not limited to, a ball grid array (BGA) board.

The first connecting member 150 may be, for example, but is not limited to, a solder bump. The first connecting member 150 may have various shapes such a land, a ball, a pin, and a pillar. The number, interval, placement form or the like of the first connecting member 150 is not limited to those shown in the drawings, and may vary depending on the design.

In some embodiments, the first connecting member 150 may have the same structure as the connecting terminals of FIG. 2, but is not limited thereto.

In some embodiments, the insulating core 101 may include an organic matter. For example, the insulating core 101 may include pre-preg. The pre-preg is a composite fiber in which reinforcing fibers such as carbon fiber, glass fiber or aramid fiber are pre-impregnated with a thermosetting polymer binder (e.g., epoxy resin) or thermoplastic resin.

In some embodiments, the PCB substrate 100 may include a copper clad laminate (CCL). For example, the PCB substrate 100 may have a structure in which a copper laminate is stacked on a single side or on both sides of a thermoset pre-preg (e.g., C-stage pre-preg).

A silicon substrate 210 may be placed on the upper surface of the PCB substrate 100. The silicon substrate 210 may include a lower surface and an upper surface that are opposite to each other. The upper surface of the silicon substrate 210 may face the semiconductor chip 300. The lower surface of the silicon substrate 210 may face the PCB substrate 100. The silicon substrate 210 may be formed of, but is not limited to, silicon (Si).

The semiconductor package 2000 according to some embodiments may further include an interlayer insulating layer 220, a silicon substrate pad 202, wiring patterns 204, vias 206, a through via 240, a second connecting member 250, an underfill 230, and a lower diode element 260.

The silicon substrate pad 202 is placed on the lower surface of the silicon substrate 210. The silicon substrate pad 202 may be used to connect components in the PCB substrate 100 and the through via 240 in the silicon substrate 210. The silicon substrate pad 202 may include, but is not limited to, metallic materials such as copper (Cu) or aluminum (Al).

The through via 240 may penetrate the silicon substrate 210. Therefore, the wiring pattern 204 and the through via 240 may be connected to each other. Through via 240 may be electrically connected to the silicon substrate pad 202. Furthermore, the through via 240 may be electrically connected to the wiring patterns 204. Therefore, the semiconductor chip 300 and the PCB substrate 100 may be electrically connected. Through via 240 may include, but is not limited to, metallic materials such as copper (Cu) or aluminum (Al).

The interlayer insulating layer 220 is placed on the silicon substrate 210. The interlayer insulating layer 220 is placed on the upper surface of the silicon substrate 210. The interlayer insulating layer 220 may include an insulating material. For example, the interlayer insulating layer 220 may include, but is not limited to, at least one of silicon oxide, silicon nitride, silicon oxynitride, and a low dielectric constant (low-k) material having a dielectric constant lower than that of silicon oxide.

The wiring patterns 204 and the vias 206 may be provided in the interlayer insulating layer 220. The wiring patterns 204 may be connected to the through via 240. Furthermore, the wiring patterns 204 may be connected to the semiconductor chip 300 through the vias 206. The wiring patterns 204 and the vias 206 may each include, but are not limited to, metal materials such as copper (Cu) or aluminum (Al).

The second connecting member 250 may be provided between the PCB substrate 100 and the silicon substrate 210. The second connecting member 250 may connect the second substrate pad 104 and the silicon substrate pad 202. Therefore, the PCB substrate 100 and the silicon substrate 210 may be electrically connected.

In some embodiments, the second connecting member 250 may be the same as the plurality of connecting terminals described using FIGS. 1 to 4. For example, the volume of the second connecting member placed in the edge region of the silicon substrate 210 among the second connecting members 250 may be greater than the volume of the second connecting member placed in the center region of the silicon substrate 210. However, embodiments are not limited thereto.

The second connecting member 250 may be, but is not limited to, a solder bump including low-melting point metals, for example, tin (Sn), tin (Sn) alloy or the like. The second connecting member 250 may have various shapes such as a land, a ball, a pin, and a pillar. The second connecting member 250 may be formed of a single layer or multiple layers. When the second connecting member 250 is formed of a single layer, the second connecting member 250 may include, for example, tin-silver (Sn-Ag) solder or copper (Cu). When the second connecting member 250 is formed of multiple layers, the second connecting member 250 may include, for example, a copper (Cu) filler and a solder. The number, interval, placement form or the like of the second connecting members 250 are not limited to those shown in the drawings, and may vary depending on the design.

An underfill 230 may be provided between the PCB substrate 100 and the silicon substrate 210. The underfill 230 may fill a space between the PCB substrate 100 and the silicon substrate 210. Also, the underfill 230 may cover the second connecting member 250. The underfill 230 may prevent the silicon substrate 210 from cracking or the like by fixing the silicon substrate 210 onto the PCB substrate 100. The underfill 230 may include, but is not limited to, an insulating polymeric material such as EMC (epoxy molding compound).

The lower diode element 260 may be placed in the silicon substrate 210. The lower diode element 260 is formed in the edge region of the silicon substrate 210, but may not be formed in the center region. The lower diode element 260 may protect the circuits from static electricity generated by other components.

The semiconductor chip 300 may be placed on the silicon substrate 210. The semiconductor chip 300 may be placed on the upper surface of the silicon substrate 210. The semiconductor chip 300 may be an integrated circuit (IC) in which hundreds to millions or more of semiconductor elements are integrated in a single chip.

In some embodiments, the semiconductor chip 300 may be a logic semiconductor chip. For example, the semiconductor chip 300 may be, but is not limited to, an application processor (AP), such as a central processing unit (CPU), a graphic processing unit (GPU), an field-programmable gate array (FPGA), a digital signal processor, an encryption processor, a micro-processor, a micro-controller, and an application specific IC (ASIC).

In some embodiments, the semiconductor chip 300 may be a memory semiconductor chip. For example, the semiconductor chip 300 may be a volatile memory such as a dynamic random access memory (DRAM) or a static random access memory (SRAM), or may be a non-volatile memory such as a flash memory, a phase-change random access memory (PRAM), a magnetoresistive random access memory (MRAM), a ferroelectric random access memory (FeRAM) or a resistive random access memory (RRAM).

As an example, the semiconductor chip 300 may be an ASIC such as a GPU, and may be a stack memory, such as a high bandwidth memory (HBM). Such a stack memory may have a form in which a plurality of integrated circuits are stacked. The stacked integrated circuits may be electrically connected to each other through a through silicon via (TSV) or the like.

In some embodiments, the semiconductor chip 300 may include an insulating layer 330, a chip pad 340, and an upper diode element 360. The insulating layer 330 may wrap the chip pad 340. The insulating layer 330 may expose the chip pad 340. The exposed chip pad 340 may be in contact with the upper pad 315. The chip pad 340 may be electrically connected to the upper pad 315. The insulating layer 330 may be made of an insulating material such as a silicon oxide film. The chip pad 340 may be formed of a conductive material such as aluminum (Al). However, embodiments are not limited thereto.

The upper diode element 360 is formed in the edge region ER of the semiconductor chip 300, but may not be formed in the center region CR. The center region CR may be defined by the edge region ER. The upper diode element 360 may protect the circuits from static electricity generated by other components.

The lower pad 310 is placed on the silicon substrate 210. The lower pad 310 is placed on the upper surface of the silicon substrate 210. The lower pad 310 may be provided between the silicon substrate 210 and the semiconductor chip 300. The lower pad 310 of FIG. 10 may be substantially identical to the lower pad (30L of FIG. 2) of FIG. 2.

For example, the lower pad 310 may include a first pad 311 and a second pad 312. The first pad 311 may be placed in the edge region of the semiconductor chip 300. For example, the first pad 311 may be placed in the vertex region of the semiconductor chip 300. The second pad 312 may be placed in the center region CR of the semiconductor chip 300. Some of the second pad 312 may be placed in the edge region ER of the semiconductor chip 300.

The first pad 311 may have a hollow pillar shape. That is, the first pad 311 may include a trench. The trench may expose the interlayer dielectric layer 220. The second pad 312 may have a solid pillar shape. However, embodiments are not limited thereto.

In some embodiments, the vias 206 are connected to the second pad 312. The vias 206 are not connected to the first pad 311. However, embodiments are not limited thereto. The vias 206 may be provided between the first pad 311 and the wiring patterns 204.

The lower pad 310 may include, but is not limited to, metallic materials such as copper (Cu) or aluminum (Al).

The upper pad 315 is placed on the silicon substrate 210. The upper pad 315 is placed on the lower pad 310. The upper pad 315 may be spaced apart from the lower pad 310 in the vertical direction. The upper pad 315 of FIG. 10 may be substantially identical to the upper pad (30U of FIG. 2) of FIG. 2. The upper pad 315 may correspond to the lower pad 310.

The upper pad 315 may include, for example, but is not limited to, metallic materials such as copper (Cu) or aluminum (Al).

A plurality of connecting terminals 350 may be placed between the silicon substrate 210 and the semiconductor chip 300. The plurality of connecting terminals 350 may be placed between the lower pad 310 and the upper pad 315. The plurality of connecting terminals 350 may be connected to the lower pad 310 and the upper pad 315. The plurality of connecting terminals 350 of FIG. 10 may be substantially identical to the plurality of connecting terminals 35 of FIG. 2.

For example, the plurality of connecting terminals 350 may include a first connecting terminal 351 and a second connecting terminal 352. The first connecting terminal 351 may be connected to the first pad 311, and the second connecting terminal 352 may be connected to the second pad 312.

The first connecting terminal 351 includes a first portion 351-1 and a second portion 351-2. The first portion 351-1 of the first connecting terminal 351 is placed inside the trench of the first pad 311. The second portion 351-2 of the first connecting terminal 351 is placed on the first portion 351-1 of the first connecting terminal 351. The first portion 351-1 of the first connecting terminal 351 overlaps the first pad 311 and the second pad 312 in the horizontal direction. The first portion 351-1 of the first connecting terminal 351 does not overlap the second connecting terminal 352 in the horizontal direction. A height of the first portion 351-1 of the first connecting terminal 351 is identical to a height of the first pad 311 and a height of the second pad 312. A height of the second portion 351-2 of the first connecting terminal 351 may be identical to a height of the second connecting terminal 352. However, embodiments are not limited thereto.

The plurality of connecting terminals 350 may be a solder bump including a low-melting point metal, for example, but not limited to, tin (Sn), tin (Sn) alloy, or the like. The plurality of connecting terminals 350 may have various shapes such as a land, a ball, a pin, and a pillar. Also, the plurality of connecting terminals 350 may include UBM (Under Bump Metallurgy).

A semiconductor package 2000 according to some embodiments may further include a first insulating adhesive layer 320. The first insulating adhesive layer 320 may be provided between the semiconductor chip 300 and the interlayer insulating layer 220. The first insulating adhesive layer 320 may cover the plurality of connecting terminals 350. The first insulating adhesive layer 320 may include a non-conductive film (NCF), a non-conductive paste (NCP), an insulating polymer or an epoxy resin. However, embodiments are not limited thereto.

The semiconductor package 2000 according to some embodiments may further include a mold layer 410, an adhesive layer 420, and a heat slug 430.

The mold layer 410 may be placed on the silicon substrate 210. The mold layer 410 may cover side walls of the semiconductor chip 300. The mold layer 400 may include, but is not limited to, an insulating polymeric material such as EMC.

The adhesive layer 420 may be provided on the mold layer 410. The adhesive layer 420 may be provided on the semiconductor chip 300. The adhesive layer 420 may be in contact with the upper surface of the mold layer 410. The adhesive layer 420 may be in contact with the upper surface of the semiconductor chip 300. The adhesive layer 420 may bond and fix the mold layer 410, the semiconductor chip 300, and the heat slug 430 to each other. The adhesive layer 420 may include an adhesive material. For example, the adhesive layer 420 may include a curable polymer. The adhesive layer 420 may include, for example, an epoxy-based polymer.

A heat slug 430 may be placed on the PCB substrate 100. The heat slug 430 may cover the semiconductor chip 300. The heat slug 430 may include, but is not limited to, a metallic material.

Figure 11:
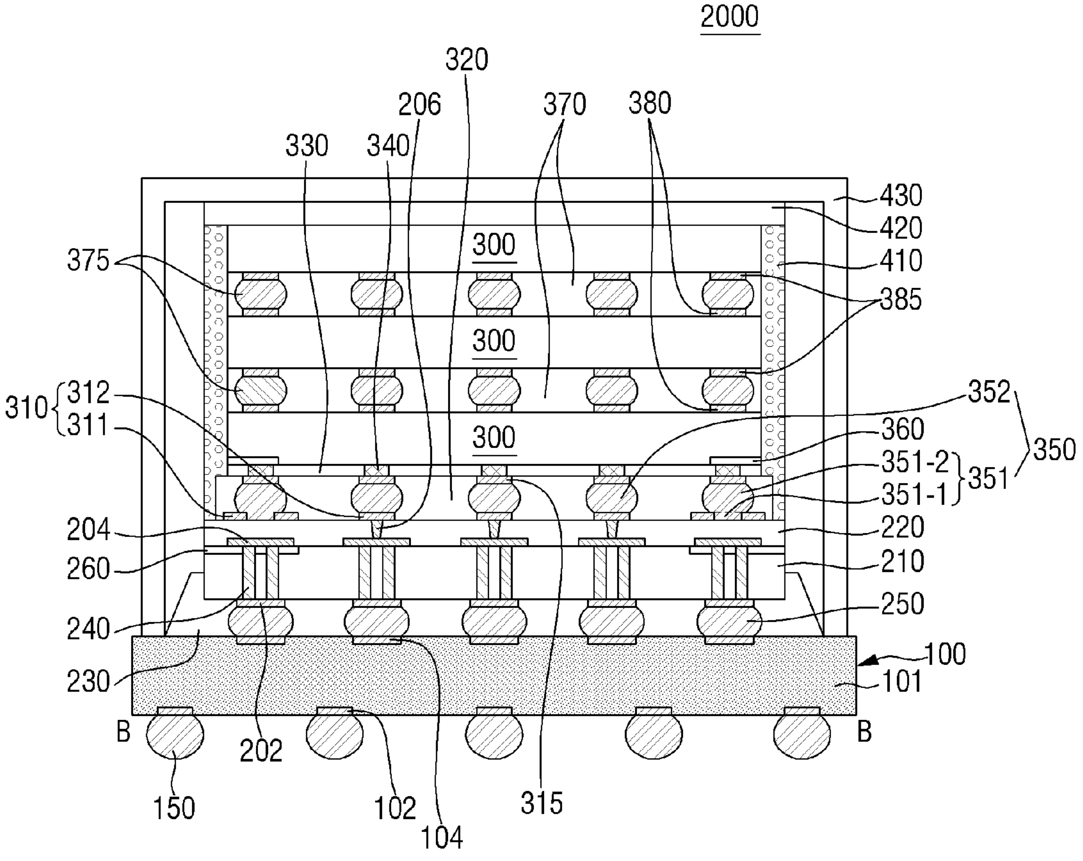
FIG. 11 is a diagram illustrating a semiconductor package according to some other embodiments.

FIG. 11 is a diagram illustrating a semiconductor package according to some other embodiments. For convenience of explanation, the explanation will be mainly provided on points different from the contents explained using FIGS. 9 and 10.

Referring to FIG. 11, in the semiconductor package 2000 according to some embodiments, the number of semiconductor chips 300 may be at least one or more. At least one or more semiconductor chips 300 may be stacked in the vertical direction. In FIG. 11, although the semiconductor package 2000 according to some embodiments is shown to include three semiconductor chips 300, this is only for convenience of explanation, and embodiments are not limited thereto.

In some embodiments, the chip placed in the lowermost part among the semiconductor chips 300 may be a buffer die. The buffer die may also be an interface die, a base die, a logic die, a master die, and the like. The remaining semiconductor chip 300 may be a core die. The core die may also be a memory die, a slave die, or the like.

The semiconductor package 2000 according to some embodiments may further include a plurality of core connecting terminals 375, a second insulating adhesive layer 370, a plurality of lower core pads 380, and a plurality of upper core pads 385.

The plurality of core connecting terminals 375 may be provided between the semiconductor chips 300. One ends of the plurality of core connecting terminals 375 may be connected to the plurality of lower core pads 380, and the other ends of the plurality of core connecting terminals 375 may be connected to the plurality of upper core pads 385.

The plurality of core connecting terminals 375 may be substantially identical to the plurality of connecting terminals 35 in FIG. 2. The plurality of lower core pads 380 may be substantially identical to the plurality of lower pads 30L of FIG. 2. The plurality of upper core pads 385 may be substantially identical to the plurality of upper pads 30U of FIG. 2.

The second insulating adhesive layer 370 may be provided between the semiconductor chips 300. The second insulating adhesive layer 370 may cover the plurality of core connecting terminals 375. The second insulating adhesive layer 370 may include a non-conductive film (NCF), a non-conductive paste (NCP), an insulating polymer, or an epoxy resin. However, embodiments are not limited thereto.

The mold layer 410 may cover side walls of the semiconductor chip 300. The upper surface of the mold layer 410 may be coplanar to the upper surface of the chip placed in the uppermost part among the semiconductor chips 300. However, embodiments are not limited thereto.

Figure 12:
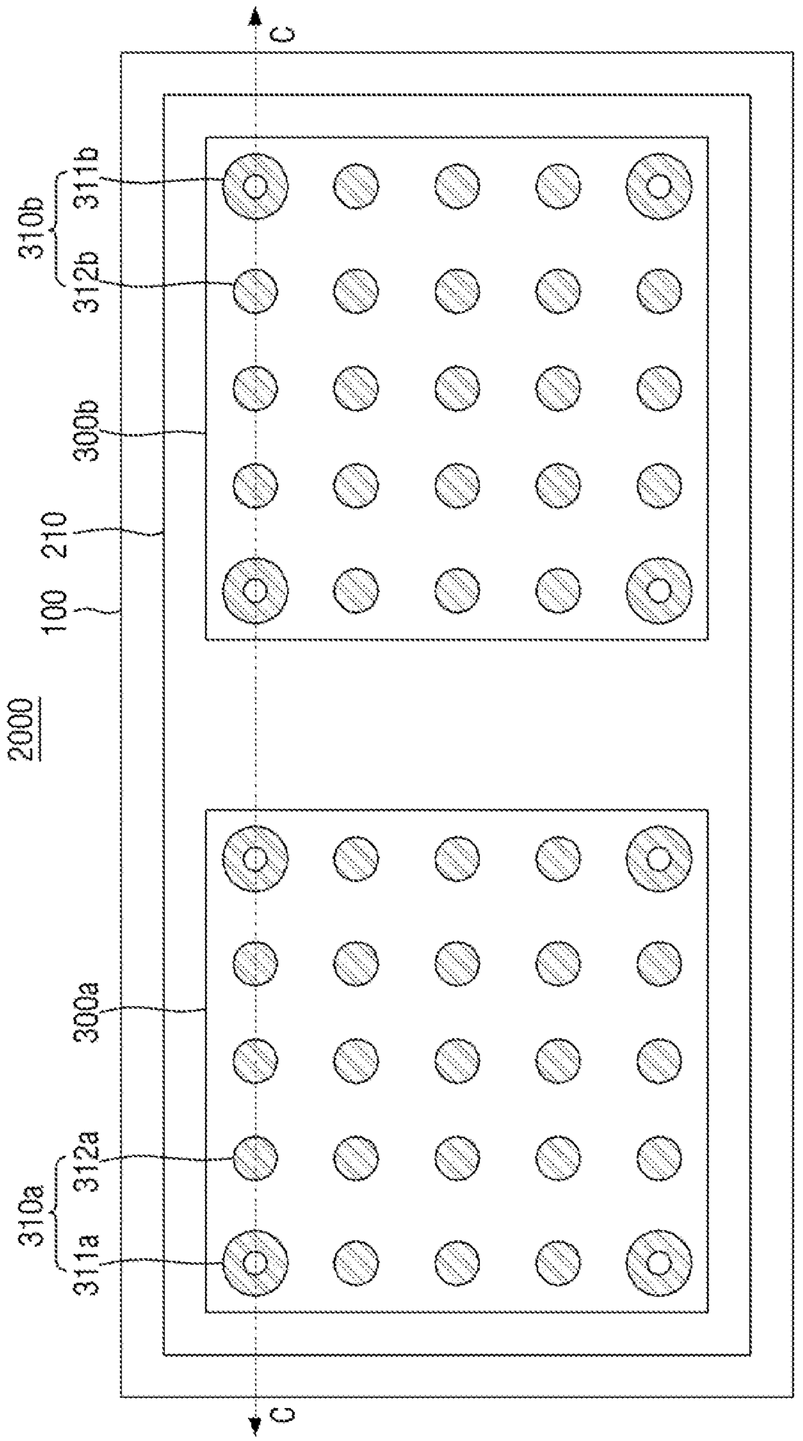
FIG. 12 is an exemplary plan view illustrating a semiconductor package according to some other embodiments.
Figure 13:
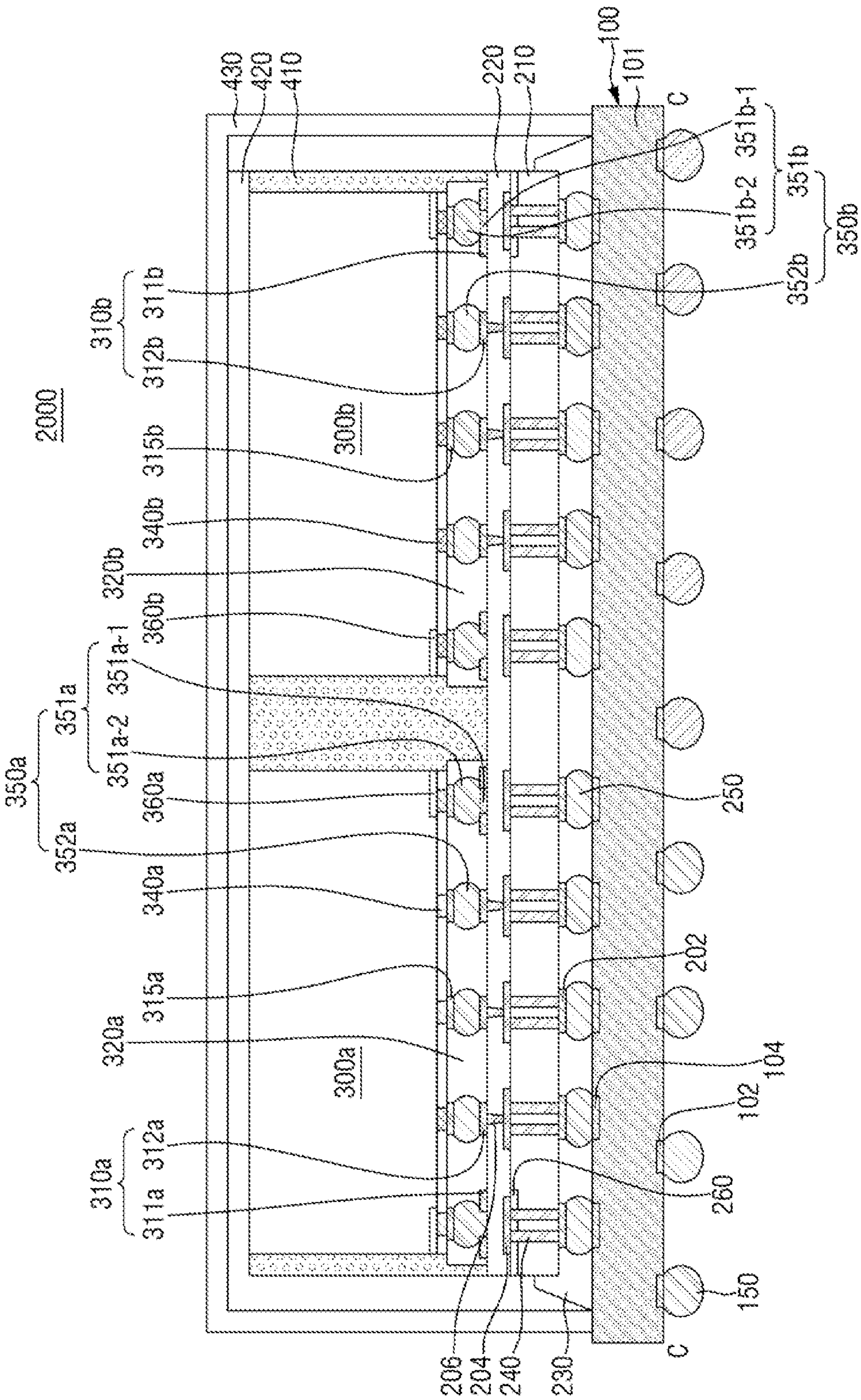
FIG. 13 is a cross-sectional view taken along line C-C of FIG. 12.

FIG. 12 is an exemplary plan view illustrating a semiconductor package according to some other embodiments. FIG. 13 is a cross-sectional view taken along line C-C of FIG. 12. For convenience of explanation, the explanation will be mainly provided on points different from the contents explained using FIGS. 1 to 4, 9 and 10.

Referring to FIGS. 12 and 13, the semiconductor package 2000 according to some other embodiments may be a 2.5D package. For example, the semiconductor chip may include a first semiconductor chip 300*a* and a second semiconductor chip 300*b*. The first semiconductor chip 300*a* and the second semiconductor chip 300*b* may be spaced apart from each other in the horizontal direction. The first semiconductor chip 300*a* and the second semiconductor chip 300*b* may be spaced apart from the silicon substrate 210 in the vertical direction.

In some embodiments, the first semiconductor chip 300*a* may be a logic semiconductor chip. For example, the first semiconductor chip 300*a* may be, for example, but is not limited to an application processor (AP), such as a central processing unit (CPU), a graphic processing unit (GPU), a field-programmable gate array (FPGA), a digital signal processor, an encryption processor, a micro-processor, a micro-controller, and an application-specific integrated circuit (ASIC).

In some embodiments, the second semiconductor chip 300*b* may be a memory semiconductor chip. For example, the second semiconductor chip 300*b* may be a volatile memory such as a dynamic random access memory (DRAM) or a static random access memory (SRAM), or may be a non-volatile memory such as a flash memory, a phase-change random access memory (PRAM), a magnetoresistive random access memory (MRAM), a ferroelectric random access memory (FeRAM) or a resistive random access memory (RRAM).

As an example, the first semiconductor chip 300*a* may be an ASIC such as a GPU, and the second semiconductor chip 300*b* may be a stack memory such as a high bandwidth memory (HBM). Such a stack memory may have a form in which a plurality of integrated circuits are stacked. The stacked integrated circuits may be electrically connected to each other through a through silicon via (TSV) or the like.

In some embodiments, each of a first sub-connecting terminal 350*a*, a first sub-lower pad 310*a*, and a first sub-upper pad 315*a* may be placed between the first semiconductor chip 300*a* and the silicon substrate 210.

The first sub-lower pad 310*a* may include a first sub-pad 311*a* and a second sub-pad 312*a*. The first sub-connecting terminal 350*a* includes a first-1 sub-connecting terminal 351*a* and a first-2 sub-connecting terminal 352*a*. The first-1 sub-connecting terminal 351*a* includes a first portion 351*a*-1 and a second portion 351*a*-2.

A second sub-connecting terminal 350*b*, a second sub-lower pad 310*b* and a second sub-upper pad 315*b* may be placed between the second semiconductor chip 300*b* and the silicon substrate 210. The second sub-lower pad 310*b* may include a first sub-pad 311*b* and a second sub-pad 312*b*. The second sub-connecting terminal 350*b* includes a second-1 sub-connecting terminal 351*b* and a second-2 sub-connecting terminal 352*b*. Again, the second-1 sub-connecting terminal 351*b* includes a first portion 351*b*-1 and a second portion 351*b*-2.

The first sub-connecting terminal 350*a* and the second sub-connecting terminal 350*b* may be substantially identical to the connecting terminal 35 of FIG. 2. The first sub-lower pad 310*a* and the second sub-lower pad 310*b* may be substantially identical to the lower pad 30L of FIG. 2. The first sub-upper pad 315*a* and the second sub-upper pad 315*b* may be substantially identical to the upper pad 30U of FIG. 2.

In some embodiments, the first chip pad 340*a* may be connected to the first semiconductor chip 300*a*. The second chip pad 340*b* may be connected to the second semiconductor chip 300*b*. The first chip pad 340*a* and the second chip pad 340*b* may be substantially identical to the chip pad 340 of FIG. 10.

In some embodiments, a first upper diode element 360*a* is provided inside the first semiconductor chip 300*a*. The second upper diode element 360*b* is provided inside the second semiconductor chip 300*b*. The first upper diode element 360*a* and the second upper diode element 360*b* may be substantially identical to the upper diode element 360 of FIG. 10.

In some embodiments, a first sub-adhesive layer insulating layer 320*a* may be provided between the first semiconductor chip 300*a* and the interlayer insulating layer 220. The first sub-adhesive layer insulating layer 320*a* may cover the plurality of first sub-connecting terminals 350*a*.

In some embodiments, a second sub-adhesive insulating layer 320*b* may be provided between the second semiconductor chip 300*b* and the interlayer insulating layer 220. The second sub-adhesive layer insulating layer 320*b* may cover the plurality of second sub-connecting terminals 350*b*.

The first sub-adhesive layer insulating layer 320*a* and the second sub-insulating adhesive layer 320*b* may each include a non-conductive film (NOCF), a non-conductive paste (NCP), an insulating polymer or an epoxy resin. However, embodiments are not limited thereto.

The mold layer 410 may be provided between the first semiconductor chip 300*a* and the second semiconductor chip 300*b*. The mold layer 410 may separate the first semiconductor chip 300*a* and the second semiconductor chip 300*b* from each other.

Figure 14:
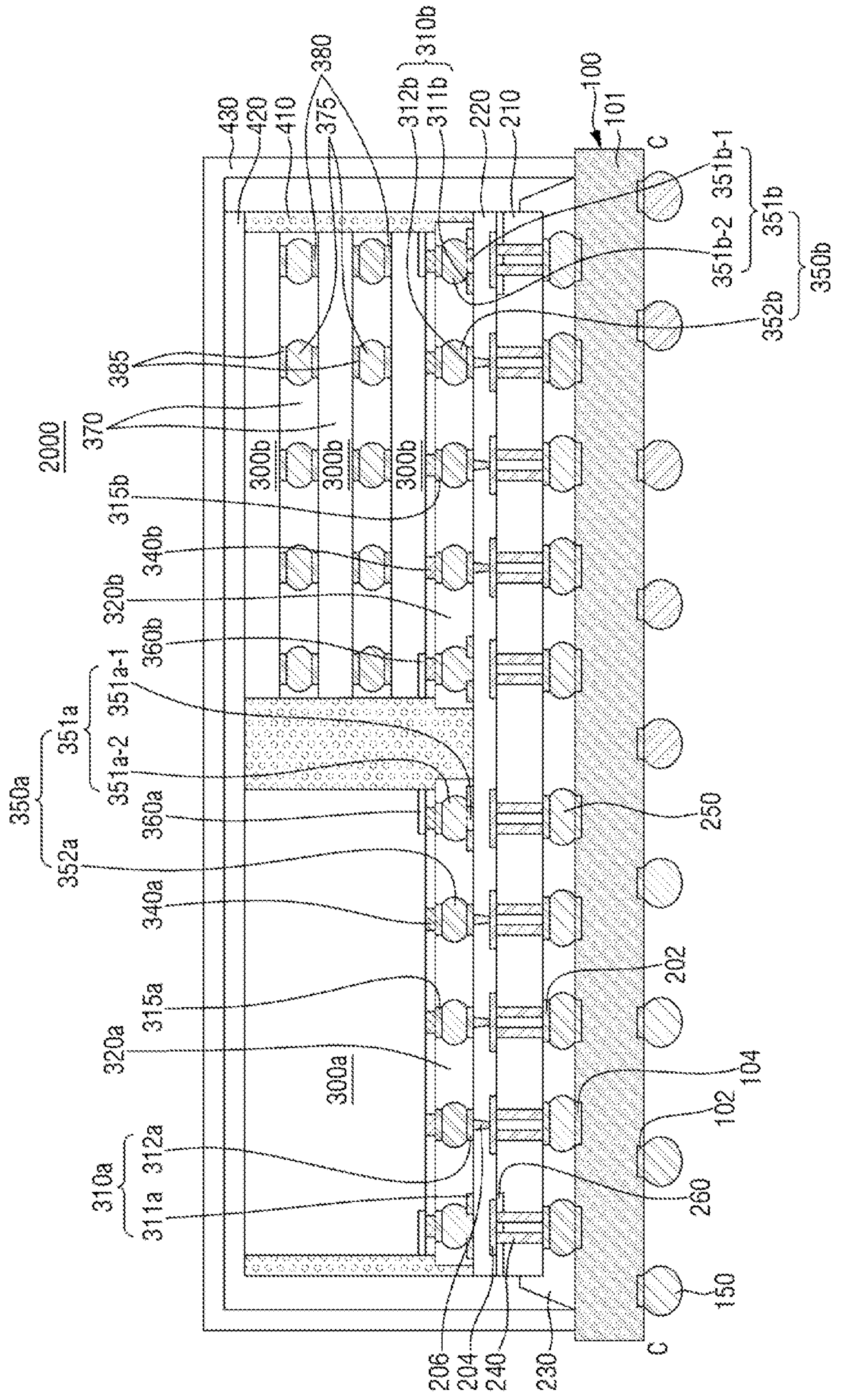
FIG. 14 is a diagram illustrating a semiconductor package according to some other embodiments.

FIG. 14 is a diagram illustrating a semiconductor package according to some other embodiments. For convenience of explanation, the explanation will be mainly provided on points different from the contents explained using FIGS. 12 and 13.

Referring to FIG. 14, there may be at least one or more second semiconductor chips 300*b*. At least one or more second semiconductor chips 300*b* may be stacked in the vertical direction. In FIG. 14, although the semiconductor package 2000 according to some embodiments is shown to include three second semiconductor chips 300*b*, embodiments are not limited thereto.

In some embodiments, the semiconductor chip placed in the lowermost part among the second semiconductor chips 300*b* may be a buffer die. The buffer die may also be an interface die, a base die, a logic die, a master die, and the like. The remaining second semiconductor chip 300*b* may be a core die. The core die may also be a memory die, a slave die, or the like.

In some embodiments, the buffer die may include a physical layer and a direct access region. The physical layer of the buffer die may include interface circuits for communicating with an external host device, and may be electrically connected to the first semiconductor chip 300*a* through the silicon substrate 210. The second semiconductor chip 300*b* may receive signals from the first semiconductor chip 300*a* or transmit signals to the first semiconductor chip 300*a* through the physical layer. Signals and/or data received through the physical layer of the buffer die may be delivered to the core die through the connecting terminals. The direct access region may provide an access path in which the second semiconductor chip 300*b* may be tested without going through the first semiconductor chip 300*a*. The direct access region may include conductive means that allows direct communication with an external test device. In some embodiments, each of the core dies may include a memory cell array.

Hereinafter, a semiconductor package according to still another embodiment will be described with reference to FIGS. 15 to 17.

Figure 15:
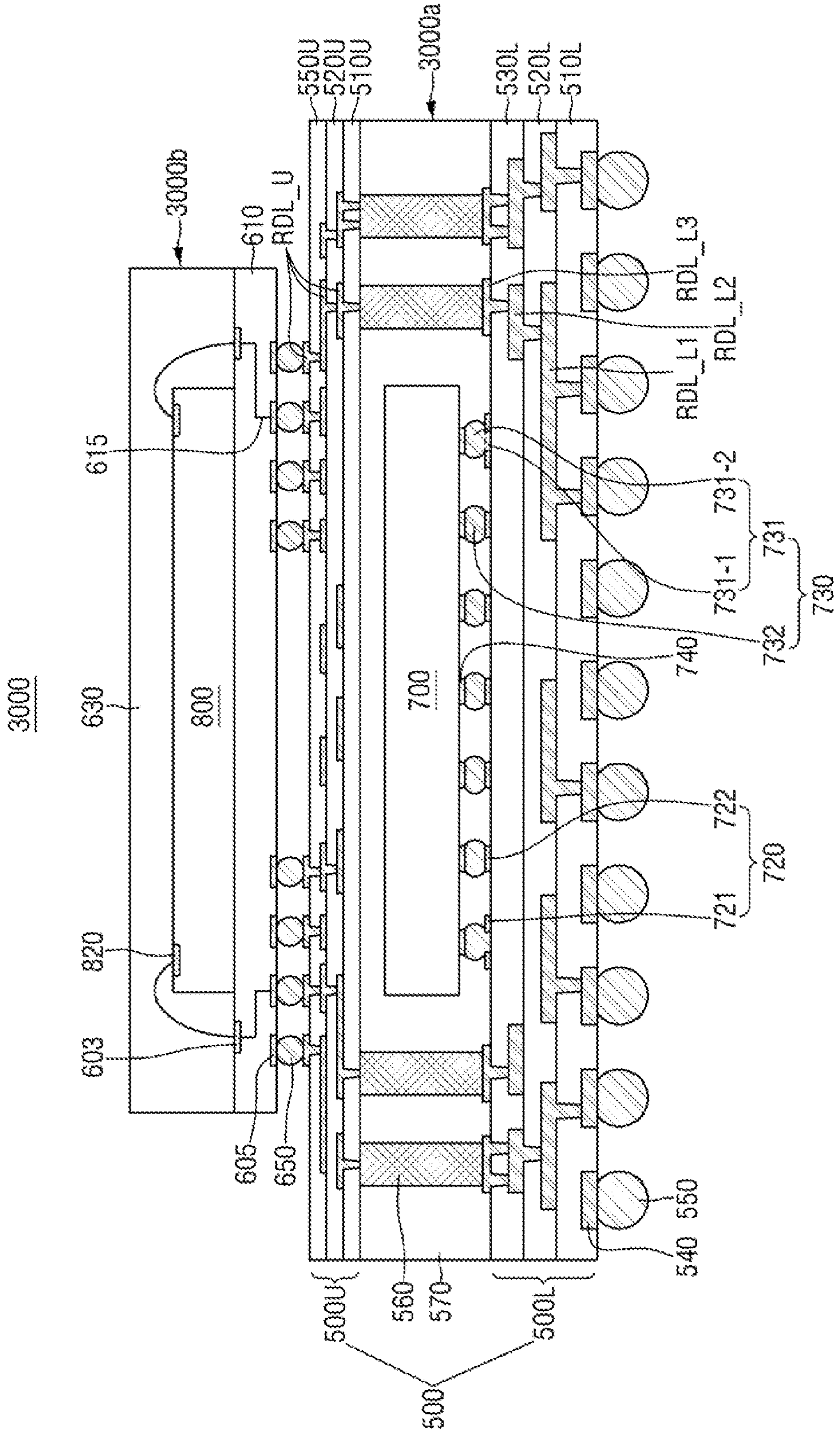
FIGS. 15, 16, and 17 are diagrams illustrating a semiconductor package according to some other embodiments.
Figure 16:
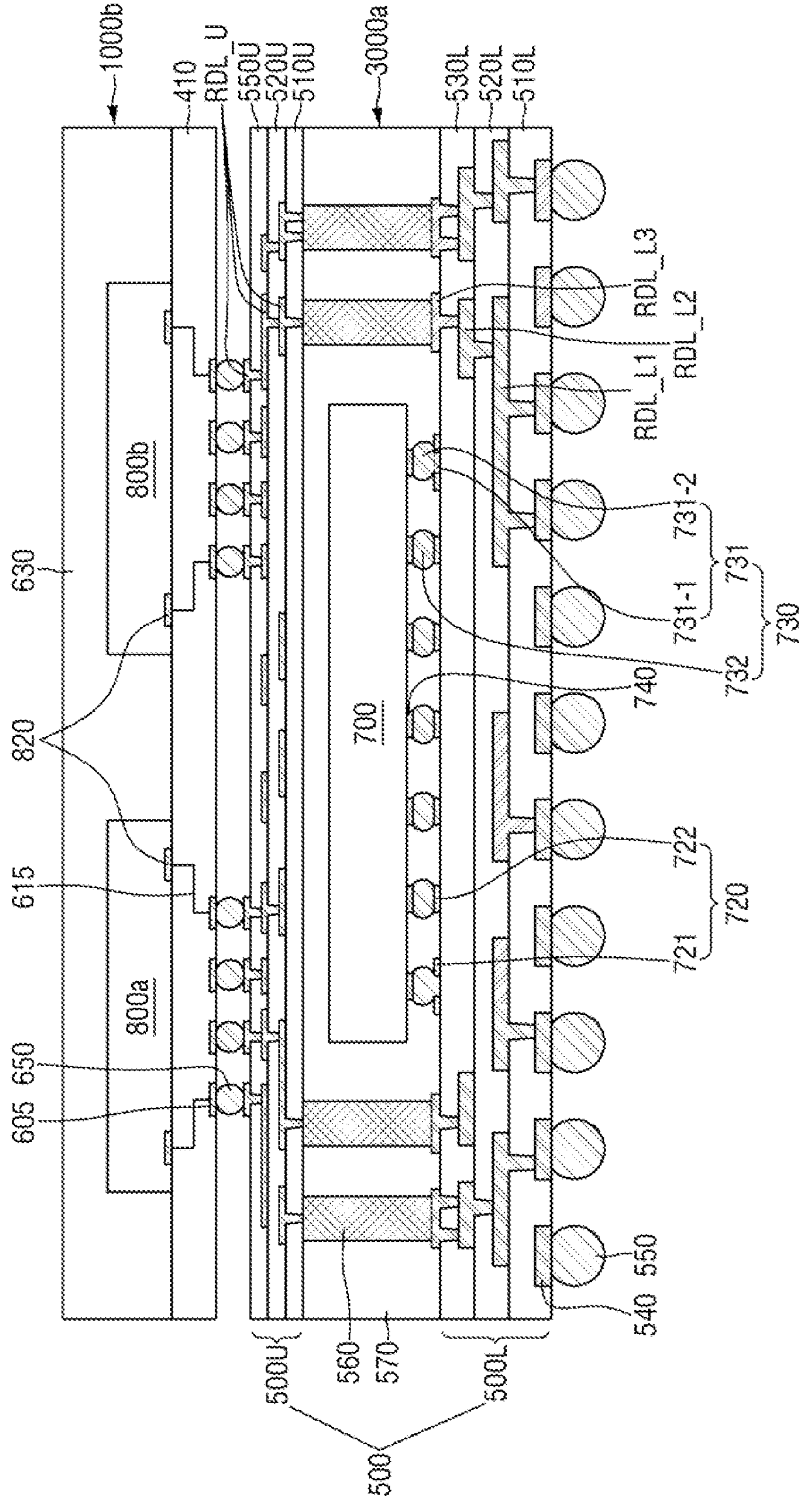
Figure 17:
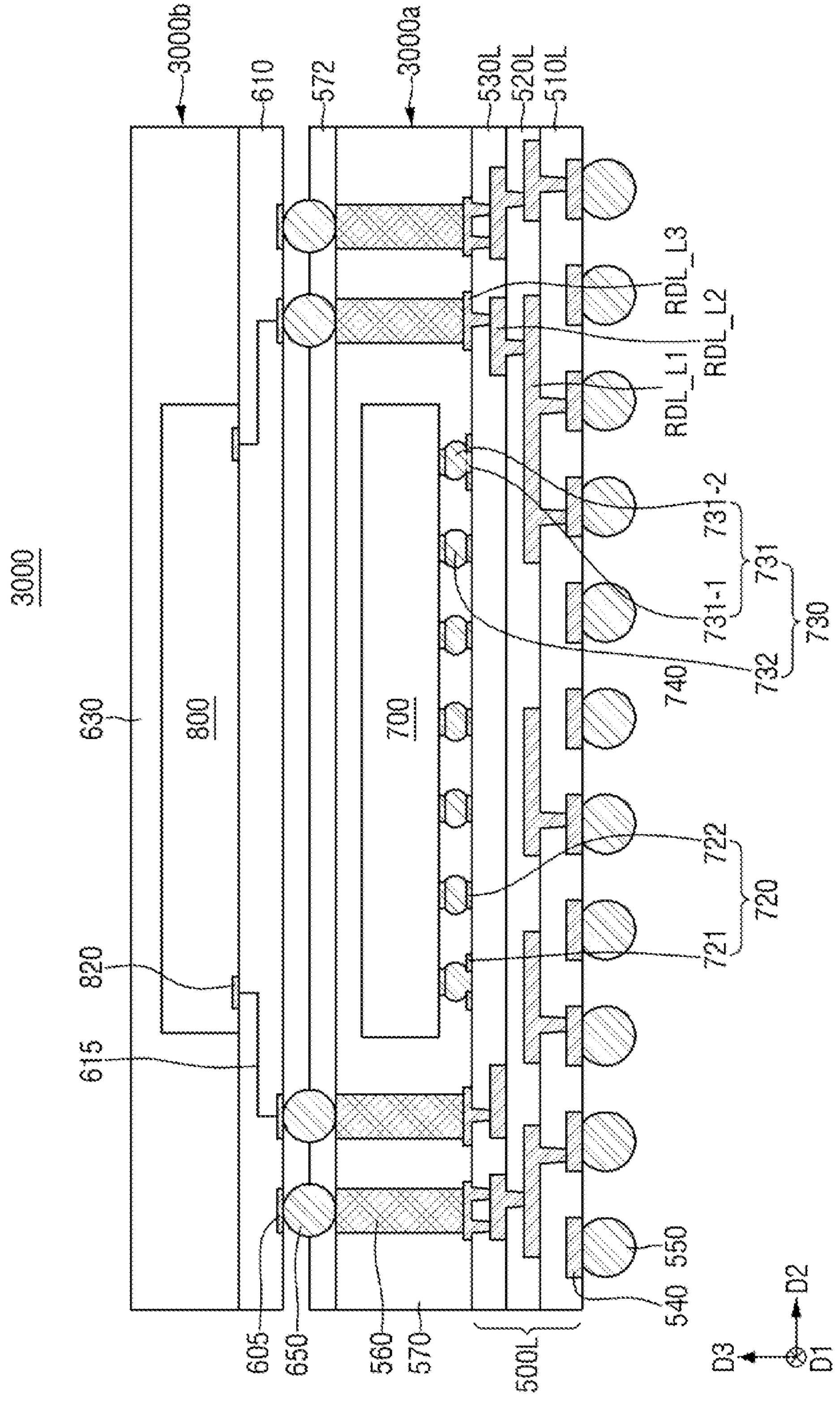

FIGS. 15 to 17 are diagrams illustrating a semiconductor package according to some other embodiments. A semiconductor package 3000 shown in FIGS. 15 to 17 may be a wafer level package (WAP).

Referring to FIG. 15, the semiconductor package 3000 according to some embodiments may include a first semiconductor package 3000*a* and a second semiconductor package 3000*b* provided on the first semiconductor package 3000*a*.

The first semiconductor package 3000*a* may include a package substrate 500, a first semiconductor chip 700, a plurality of pad patterns 540 and a plurality of first connecting members 550.

The package substrate 500 may include a lower package substrate 500L and an upper package substrate 500U. The lower package substrate 500L may be placed under the first semiconductor chip 700. The upper package substrate 500U may be placed over the first semiconductor chip 700.

The lower package substrate 500L may include a first lower insulating layer 510L, a second lower insulating layer 520L, and a third lower insulating layer 530L. A first lower redistribution pattern RDL_L1, a second lower redistribution pattern RDL_L2, and a third lower redistribution pattern RDL_L3 and a plurality of pad patterns 540 may be placed inside the first to third lower insulating layers 510L, 520L and 530L.

For example, the first lower insulating layer 510L may wrap the pad pattern 540. The pad pattern 540 may expose one side of the first lower insulating layer 510L. The first lower insulating layer 510L may surround a via portion of the first lower redistribution pattern RDL_L1. The second lower insulating layer 520L may surround a wiring portion of the first lower redistribution pattern RDL_L1. Also, the second lower insulating layer 520L may surround the via portion of the second lower redistribution pattern RDL_L2. The third lower insulating layer 530L may surround the wiring portion of the second lower redistribution pattern RDL_L2. The third lower insulating layer 530L may surround the via portion of the third lower redistribution pattern RDL_L3. However, embodiments are not limited thereto.

Each of the first to third lower insulating layers 510L, 520L and 530L may be made of a photoimageable dielectric. For example, the first to third lower insulating layers 510L, 520L, and 530L may include a photosensitive polymer. The photosensitive polymer may be formed of at least one of, for example, photosensitive polyimide, polybenzoxazole, phenolic polymer, and benzocyclobutene-based polymer. As another example, the first to third lower insulating layers 510L, 520L, and 530L may be formed of a silicon oxide film, a silicon nitride film or a silicon oxynitride film.

Each of the first to third lower redistribution patterns RDL_L1, RDL_L2, and RDL_L3 may include a conductive material. For example, the first to third lower redistribution patterns RDL_L1, RDL_L2, and RDL_L3 may include, but are not limited to, copper (Cu).

In some embodiments, the lower package substrate 500L may include organic materials. For example, the lower package substrate 500L may include a pre-preg. The pre-preg is a composite fiber in which reinforcing fibers such as carbon fiber, glass fiber or aramid fiber are pre-impregnated with a thermosetting polymer binder (e.g., epoxy resin) or thermoplastic resin. In some embodiments, the lower package substrate 500L may include a copper clad laminate (CCL). For example, the lower package substrate 500L may have a structure in which a copper laminate is stacked on a single side or both sides of a thermoset pre-preg (e.g., C-stage pre-preg).

A plurality of pad patterns 540 may be provided inside the lower package substrate 500L. The plurality of pad patterns 540 may be provided inside the first lower insulating layer 510L. In some embodiments, the plurality of pad patterns 540 may be connected to the plurality of first connecting members 550.

Each of the plurality of pad patterns 540 may include a conductive material. For example, the plurality of pad patterns 540 may include, but are not limited to, copper (Cu).

A plurality of first connecting members 550 may be provided on the pad pattern 540. The plurality of first connecting members 550 may be connected to the pad pattern 540. Although each of the plurality of first connecting members 550 is shown to have a ball shape, embodiments are not limited thereto. Each of the plurality of first connecting members 550 may have various shapes such as a land, a ball, a pin, and a pillar. The number, interval, placement form or the like of the plurality of first connecting members 550 are not limited to those shown in the drawings, and may vary depending on the design. Each of the plurality of first connecting members 550 may be, but is not limited to, a solder bump including a low-melting point metal, for example, tin (Sn), tin (Sn) alloys, and the like.

The semiconductor package 3000 according to some embodiments may further include a plurality of metal pillars 560, a molding film 570, a plurality of lower pads 720, a plurality of upper pads 740, and a plurality of connecting terminals 730.

The first semiconductor chip 700 may be mounted on the lower package substrate 500L. The plurality of lower pads 720 may be provided on the upper surface of the lower package substrate 500L. The plurality of upper pads 740 may be provided on the lower surface of the first semiconductor chip 700.

In some embodiments, the plurality of lower pads 720 of FIG. 15 may be substantially identical to the plurality of lower pads 30L in FIG. 2. For example, the plurality of lower pads 720 may include a first pad 721 and a second pad 722. The first pad 721 may be placed in the edge region ER of the first semiconductor chip 700. The second pad 722 may be placed in the center region CR of the first semiconductor chip 700. The center region CR may be defined by the edge region ER.

For example, the first pad 721 may have a hollow pillar shape, and the second pad 722 may have a solid pillar shape. For example, the first pad 721 may include a trench. Some of the connecting terminal 730 may be placed inside the trench.

A plurality of connecting terminals 730 may be attached between the plurality of lower pads 720 and the plurality of upper pads 740. The first semiconductor chip 700 and the first connecting member 550 may be electrically connected through the plurality of connecting terminals 730.

In some embodiments, the plurality of connecting terminals 730 of FIG. 15 may be substantially identical to the plurality of connecting terminals 35 in FIG. 2.

For example, the plurality of connecting terminals 730 may include a first connecting terminal 731 and a second connecting terminal 732. The first connecting terminal 731 is connectable with the first pad 721, and the second connecting terminal 732 is connectable with the second pad 722. The first connecting terminal 731 includes a first portion 731-1 and a second portion 731-2. The first portion 731-1 of the first connecting terminal 731 is placed in the trench of the first pad 721. The first portion 731-1 of the first connecting terminal 731 overlaps the second pad 722 in the horizontal direction. The first portion 731-1 of the first connecting terminal 731 does not overlap the second connecting terminal 732 in the horizontal direction. The volume of the first connecting terminal 731 may be greater than the volume of the second connecting terminal 732.

The plurality of connecting terminals 730 may be solder bumps including, but are not limited to, low-melting point metals, for example, tin (Sn), tin (Sn) alloys and the like. The plurality of connecting terminals 730 may have various shapes such as a land, a ball, a pin, and a pillar. The plurality of connecting terminals 730 may be formed of a single layer or multiple layers. When the plurality of connecting terminals 730 are formed of a single layer, the plurality of connecting terminals 730 may include, for example, tin-silver (Sn-Ag) solder or copper (Cu). When the plurality of connecting terminals 730 are formed of the multiple layers, the plurality of connecting terminals 730 may include, for example, copper (Cu) filler and solder. The number, interval, placement form or the like of the plurality of connecting terminals 730 are not limited to those shown in the drawings, and may vary depending on the design.

Metal pillars 560 may be provided around the first semiconductor chip 700. The metal pillars 660 may electrically connect the lower package substrate 500L and the upper package substrate 500U. The metal fillers 560 may penetrate the molding film 570.

The upper surfaces of the metal fillers 560 may be coplanar to the upper surface of the molding film 570. Lower surfaces of the metal pillars 560 may be in contact with the third lower redistribution patterns RDL_L3 of the lower package substrate 500L.

The molding film 570 may be provided between the lower package substrate 500L and the upper package substrate 500U. The molding film 570 may cover the first semiconductor chip 700. The molding film 570 may cover side walls and the upper surface of the first semiconductor chip 700. The molding film 570 may be filled between the metal fillers 560. The thickness of the molding film 570 may be substantially identical to the thickness of the metal fillers 560. The molding film 570 may include an insulating polymer such as an epoxy-based molding compound.

The upper package substrate 500U may include a first upper insulating layer 510U, a second upper insulating layer 520U, and a third upper insulating layer 530U, and upper redistribution patterns RDL_U in the first to third upper insulating layers 510U, 520U and 530U. The first to third upper insulating layers 510U, 520U and 530U may include the same material as that included in the first to third lower insulating layers 510L, 520L and 530L.

For example, each of the first to third upper insulating layers 510U, 520U, and 530U may be made of a photoimageable dielectric. For example, the first to third upper insulating layers 510U, 520U, and 530U may include a photosensitive polymer. The photosensitive polymer may be formed of at least one of, for example, photosensitive polyimide, polybenzoxazole, phenolic polymer, and benzocyclobutene-based polymer. As another example, the first to third upper insulating layers 510U, 520U, and 530U may be formed of a silicon oxide film, a silicon nitride film or a silicon oxynitride film.

The upper redistribution patterns RDL_U may include the same materials as those of the first to third lower redistribution patterns RDL_L1, RDL_L2, and RDL_L3. For example, the upper redistribution patterns RDL_U may include, but are not limited to, copper (Cu).

A second semiconductor package 3000*b* may be placed on the upper package substrate 500U. The second semiconductor package 3000*b* may include a circuit board 610, a second semiconductor chip 800, and an upper molding film 630. The circuit board 610 may be, but is not limited to, a printed circuit board. A lower conductive pad 605 may be placed on the lower surface of the circuit board 610.

A second semiconductor chip 800 may be placed on the circuit board 610. The second semiconductor chip 800 may include integrated circuits. The integrated circuits may include a memory circuit, a logic circuit or a combination thereof. The semiconductor chip pads 820 of the second semiconductor chip 800 may be electrically connected to the upper conductive pads 603 on the upper surface of the circuit board 610 by wire bonding. The upper conductive pad 603 on the upper surface of the circuit board 610 may be electrically connected to the lower conductive pad 605 through an internal wiring 615 inside the circuit board 610.

The upper molding film 630 may be provided on the circuit board 610. The upper molding film 630 may cover the second semiconductor chip 800. The upper molding film 630 may include an insulating polymer such as an epoxy-based polymer.

The semiconductor package 3000 according to some embodiments may further include a plurality of second connecting members 650. The second connecting members 650 may be provided between the lower conductive pad 605 of the circuit board 610 and the upper redistribution patterns RLD_U. The second connecting members 650 may be, but are not limited to, solder bumps including low-melting point metals, for example, tin (Sn), tin (Sn) alloys and the like. The second connecting members 650 may have various shapes such as a land, a ball, a pin, and a pillar. The second connecting members 650 may be formed of a single layer or multiple layers. When the second connecting members 650 are formed of a single layer, the second connecting member 650 may include, for example, tin-silver (Sn-Ag) solder or copper (Cu). When the second connecting members 650 are formed of multiple layers, the second connecting members 650 may include, for example, copper (Cu) filler and solder. The number, interval, placement form or the like of the second connecting members 650 are not limited to those shown in the drawings, and may vary depending on the design.

In some embodiments, the plurality of second connecting members 650 may be substantially identical to the plurality of connecting terminals 35 in FIG. 2.

Referring to FIG. 16, a second semiconductor package 3000*b* may include two second semiconductor chips 800*a* and 800*b*. For example, the second semiconductor chip may include a first sub-semiconductor chip 800*a* and a second sub-semiconductor chip 800*b*.

The first sub-semiconductor chip 800*a* and the second sub-semiconductor chip 800*b* may be spaced apart from each other. The first sub-semiconductor chip 800*a* and the second sub-semiconductor chip 800*b* may be separated from each other by the upper molding film 630. Each of the first sub-semiconductor chip 800*a* and the second sub-semiconductor chip 800*b* may include semiconductor chip pads 820 on their lower surfaces. The second semiconductor package 3000*b* does not include the upper conductive pad 603. As an example, the semiconductor chip pads 820 may be electrically connected to the lower conductive pads 605 through the internal wirings 615 inside the circuit board 610.

Although FIG. 16 shows that the first and second sub-semiconductor chips 800*a* and 800*b* are provided at the same level on the upper surface of the circuit board 610 in the vertical direction, the first sub-semiconductor chip 800*a* and the second sub-semiconductor chip 800*b* may be sequentially stacked on the upper surface of the circuit board 610 at the same level.

Referring to FIG. 17, unlike the embodiment shown in FIG. 15, the upper package substrate may be omitted in the first semiconductor package 3000*a*.

For example, an upper insulating layer 572 may be provided on the molding film 570. The upper insulating layer 572 may include an insulating material. For example, the upper insulating layer 572 may include, but is not limited to, at least one of silicon oxide, silicon nitride, silicon oxynitride, and a low dielectric constant (low-k) material having a dielectric constant lower than that of silicon oxide.

The second connecting members 650 may be provided between the lower conductive pad 605 of the circuit board 610 and the metal pillars 560 of the first semiconductor package 3000*a*. Some of the second connecting members 650 may be placed inside the upper insulating layer 572. One side of the second connecting members 650 may be connected to the lower conductive pad 605, and the other sides of the second connecting members 650 may be connected to the metal pillars 560. Therefore, the first semiconductor package 3000*a* and the second semiconductor package 3000*b* may be electrically connected.

The second semiconductor chip 800 may be placed on the circuit board 610. The semiconductor chip pads 820 of the second semiconductor chip 800 may be in contact with the upper surface of the circuit board 610. The semiconductor chip pads 820 of the second semiconductor chip 800 may be electrically connected to the lower conductive pads 605 through the internal wiring 615 inside the circuit board 610.

Figure 18:
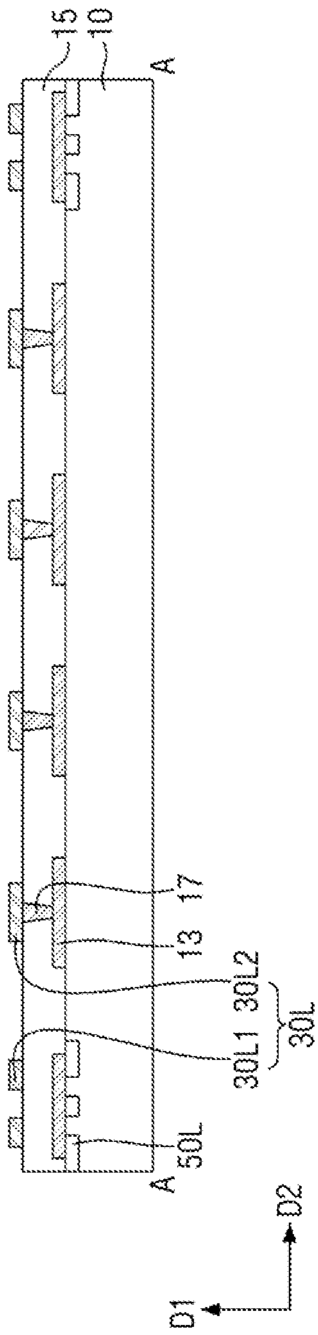
FIGS. 18 and 19 are intermediate diagrams illustrating the method for fabricating the semiconductor package according to some embodiments.
Figure 19:
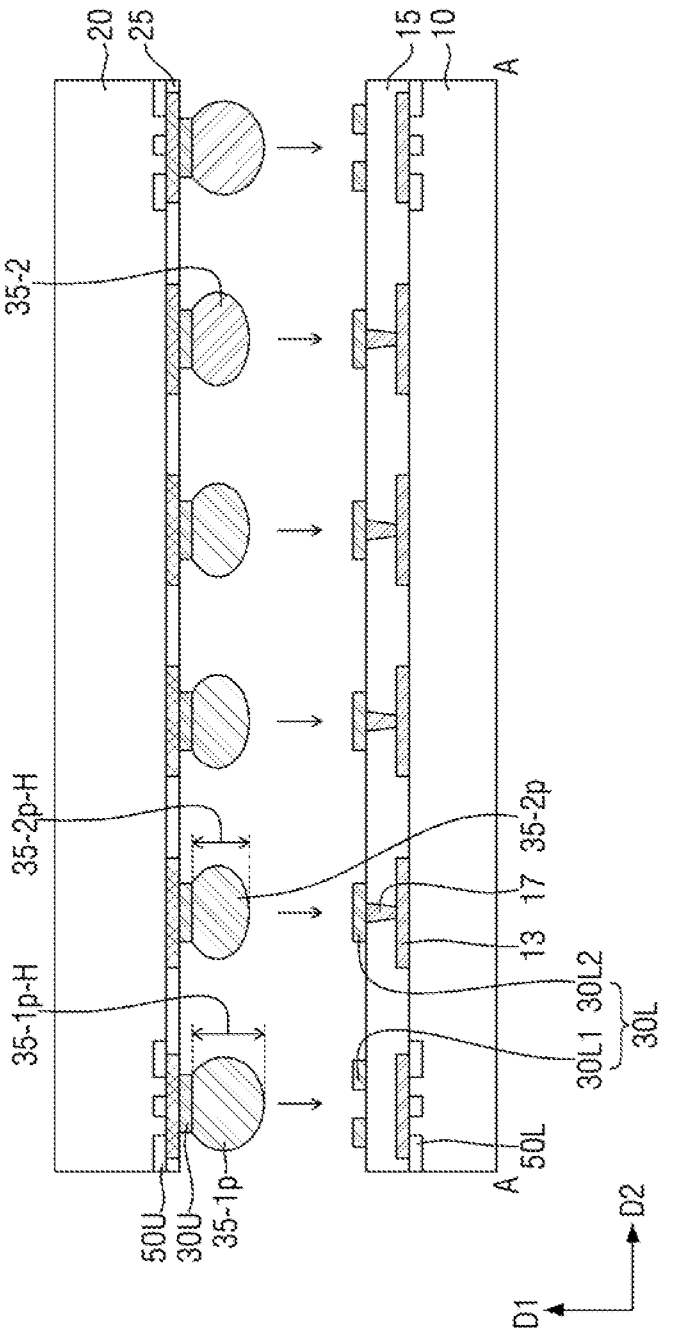

A method for fabricating a semiconductor package according to some embodiments will be described below with reference to FIGS. 18 and 19. FIGS. 18 and 19 are intermediate diagrams illustrating the method for fabricating the semiconductor package according to some embodiments.

Referring to FIG. 18, the lower substrate 10 may be provided. The lower diode element 50L may be formed inside the lower substrate 10. The lower insulating film 15 may be formed on the lower substrate 10. The wiring pattern 13 and the first via 17 may be formed inside the lower insulating film 15. The lower pad 30L is formed on the lower insulating film 15.

The lower pad 30L includes a first pad 30L1 and a second pad 30L2. The first pad 30L1 includes a trench t. The first pad 30L1 may have a hollow pillar shape. The second pad 30L2 may have a solid pillar shape. Although the first via 17 is shown as being connected to the second pad 30L2, embodiments are not limited thereto.

Referring to FIG. 19, the upper substrate 20 may be provided. The upper insulating film 25 may be formed on the upper substrate 20. The upper diode element 50U may be formed inside the upper substrate 20. The upper substrate pad 40 may be formed inside the upper insulating film 25, and the upper substrate pad 40 may expose one side of the upper insulating film 25. The upper pad 30U may be formed on the upper substrate pad 40.

Subsequently, a pre-first connecting terminal 35-1*p* and a pre-second connecting terminal 35-2*p* may be formed on the upper pad 30U. The pre-first connecting terminal 35-1*p* is formed on the upper pad 30U corresponding to the first pad 30L1, and the pre-second connecting terminal 35-2*p* may be formed on the upper pad 30U corresponding to the second pad 30L2.

In some embodiments, the volume of the pre-first connecting terminal 35-1*p* may be greater than the volume of the pre-second connecting terminal 35-2*p*. For example, a height 35-1*p*-H of the pre-first connecting terminal 35-1*p* in the first direction D1 is greater than a height 35-2*p*-H of the pre-second connecting terminal 35-2*p* in the first direction D1. As an example, although a difference between the height 35-1*p*-H of the pre-first connecting terminal 35-1*p* in the first direction D1 and the height 35-2*p*-H of the pre-second connecting terminal 35-2*p* in the first direction D1 may be 5 μm or less, embodiments are not limited thereto.

The pre-first connecting terminal 35-1*p* and the pre-second connecting terminal 35-2*p* may each have various shapes such as a land, a ball, a pin, and a pillar. Each of the pre-first connecting terminal 35-1*p* and the pre-second connecting terminal 35-2*p* may be, but is not limited to, a solder bump including a low-melting point metal, for example, tin (Sn), tin (Sn) alloys, and the like.

Subsequently, the pre-first connecting terminal 35-1*p* may be landed on the first pad 30L1. The pre-second connecting terminal 35-2*p* may landed on the second pad 30L2.

While embodiments have been described with reference to the figures, it will be understood by those of ordinary skill in the art that various changes in form and details may be made therein without departing from the spirit and scope as defined by the following claims and their equivalents.

What is claimed is:

1. A semiconductor package comprising:
a printed circuit board (PCB) substrate;
a silicon substrate on the PCB substrate;
a plurality of through vias penetrating the silicon substrate;
a plurality of pads on the silicon substrate and connected to at least some of the plurality of through vias;
a semiconductor chip on the plurality of pads and electrically connected to the plurality of pads; and
a plurality of connecting terminals between the semiconductor chip and the plurality of pads, wherein the plurality of pads comprise a first pad that includes a trench and a second pad, and wherein the plurality of connecting terminals comprise:

a first connecting terminal connected to the first pad, at least a part of the first connecting terminal being in the trench and a remaining part of the first connecting terminal being on the first pad; and a second connecting terminal connected to the second pad.

2. The semiconductor package of claim 1, wherein the first pad has a hollow pillar shape and the second pad has a solid pillar shape.

3. The semiconductor package of claim 1, wherein a width of the first pad is greater than a width of the second pad.

4. The semiconductor package of claim 3, wherein a width of the trench is equal to the width of the second pad.

5. The semiconductor package of claim 1, wherein a width of the first pad is equal to a width of the second pad.

6. The semiconductor package of claim 1, wherein a height of the first pad is equal to a height of the second pad.

7. The semiconductor package of claim 1, wherein a volume of the first connecting terminal is greater than a volume of the second connecting terminal.

8. The semiconductor package of claim 1, wherein the semiconductor chip has a square shape from a plan view, the semiconductor chip including an edge region and a center region defined by the edge region, and wherein the first connecting terminal is in the edge region and the second connecting terminal is in the center region.

9. The semiconductor package of claim 8, further comprising:

a plurality of diode elements below the semiconductor chip, wherein the plurality of diode elements are in the edge region and not in the center region.

10. The semiconductor package of claim 1, wherein the semiconductor chip has a square shape from a plan view, and wherein the first connecting terminal is at a vertex of the semiconductor chip from a plan view.

11. The semiconductor package of claim 1, wherein the first connecting terminal comprises a first portion that fills the trench and a second portion on the first portion, and wherein a height of the second portion is equal to a height of the second connecting terminal.

12. The semiconductor package of claim 1, wherein the first pad is spaced apart from the plurality of through vias.

13. A semiconductor package comprising:

a plurality of lower pads;

a plurality of upper pads corresponding to the plurality of lower pads, respectively, the plurality of upper pads being spaced apart from the plurality of lower pads in a first direction; and a plurality of connecting terminals between the plurality of lower pads and the plurality of upper pads, wherein the plurality of lower pads comprise a first pad having a hollow pillar shape and a second pad having a solid pillar shape, wherein the plurality of connecting terminals comprise a first connecting terminal connected to the first pad and a second connecting terminal connected to the second pad, wherein the first connecting terminal comprises a first portion that overlaps the first pad in a second direction different from the first direction, and a second portion on the first portion, and wherein a height of the second portion in the first direction is equal to a height of the second connecting terminal in the first direction.

14. The semiconductor package of claim 13, wherein a width of the first pad is greater than a width of the second pad in the second direction.

15. The semiconductor package of claim 13, wherein a width of the first portion of the first connecting terminal is equal to a width of the second pad in the second direction.

16. The semiconductor package of claim 13, wherein a width of the first pad is equal to a width of the second pad in the second direction.

17. The semiconductor package of claim 13, wherein a volume of the first connecting terminal is greater than a volume of the second connecting terminal.

18. The semiconductor package of claim 13, wherein the second portion overlaps the second connecting terminal in the second direction.

19. A semiconductor package comprising:

a printed circuit board (PCB) substrate;

a silicon substrate on the PCB substrate;

a plurality of through vias penetrating the silicon substrate in a vertical direction;

wiring patterns on the silicon substrate and connected to the plurality of through vias;

a plurality of pads on the silicon substrate and connected to at least some of the wiring patterns;

a semiconductor chip on the plurality of pads, electrically connected to the plurality of pads, and comprising an edge region and a center region defined by the edge region from a plan view;

a plurality of diode elements below the semiconductor chip, and in the edge region and not in the center region; and a plurality of connecting terminals between the semiconductor chip and the plurality of pads, wherein the plurality of pads comprise a first pad of a hollow pillar shape and a second pad of a solid pillar shape, wherein the plurality of connecting terminals comprise:

a first connecting terminal in the edge region and connected to the first pad; and a second connecting terminal in the center region and connected to the second pad, wherein the first connecting terminal comprises a first portion that overlaps the first pad in a horizontal direction intersecting the vertical direction and a second portion on the first portion, wherein the first portion does not overlap the second connecting terminal in the horizontal direction, and wherein a volume of the first connecting terminal is greater than a volume of the second connecting terminal.

20. The semiconductor package of claim 19, wherein a height of the second portion is equal to a height of the second connecting terminal in the vertical direction.

* * * * *